(12) United States Patent
Ono

(10) Patent No.: US 12,200,833 B2
(45) Date of Patent: Jan. 14, 2025

(54) LIGHT SOURCE DEVICE, LIGHT-EMITTING UNIT, AND MEASUREMENT APPARATUS

(71) Applicant: FUJIFILM Business Innovation Corp., Tokyo (JP)

(72) Inventor: Seiji Ono, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 126 days.

(21) Appl. No.: 17/973,531

(22) Filed: Oct. 25, 2022

(65) Prior Publication Data

US 2023/0247737 A1  Aug. 3, 2023

(30) Foreign Application Priority Data

Feb. 2, 2022  (JP) .................................. 2022-014979

(51) Int. Cl.
| | | |
|---|---|---|
| *H05B 44/00* | (2022.01) | |
| *G01S 7/484* | (2006.01) | |
| *G01S 17/894* | (2020.01) | |
| *H01S 5/042* | (2006.01) | |
| *H01S 5/42* | (2006.01) | |

(52) U.S. Cl.
CPC ............ *H05B 44/00* (2022.01); *H01S 5/0428* (2013.01); *H01S 5/423* (2013.01); *G01S 7/484* (2013.01); *G01S 17/894* (2020.01)

(58) Field of Classification Search
CPC ....... H05B 44/00; H05B 45/12; H01S 5/0428; H01S 5/423; H01S 5/0239; H01S 5/042; H01S 5/0014; H01S 5/183; G01S 7/484; G01S 17/894; G01S 7/4815
See application file for complete search history.

(56) References Cited

U.S. PATENT DOCUMENTS

| | | | |
|---|---|---|---|
| 8,698,864 B2 | 4/2014 | Nagumo | |
| 11,769,990 B2 * | 9/2023 | Kondo | ................ H01S 5/04257 356/601 |

(Continued)

FOREIGN PATENT DOCUMENTS

| | | | | |
|---|---|---|---|---|
| CN | 105049018 B | * | 2/2018 | |
| CN | 110493913 A | * | 11/2019 | ............. H05B 45/14 |

(Continued)

OTHER PUBLICATIONS

"Notice of Reasons for Refusal of Japan Counterpart Application", issued on Aug. 27, 2024, with English translation thereof, p. 1-p. 5.

*Primary Examiner* — Abdullah A Riyami
*Assistant Examiner* — Syed M Kaiser
(74) *Attorney, Agent, or Firm* — JCIPRNET

(57) ABSTRACT

A light source device includes: a light-emitting section including a light-emitting element, the light-emitting element including a thyristor; a setter that sets the light-emitting element of the light-emitting section as a light-emitting element that emits light; and a controller that cancels an ON setting received from the setter after shifting the light-emitting element to a state in which the light-emitting element is able to emit light and that causes the light-emitting element to emit light multiple times by turning ON and OFF a light-emitting current, the light-emitting current causing the light-emitting element to emit light.

20 Claims, 14 Drawing Sheets

(56) References Cited

U.S. PATENT DOCUMENTS

| | | | | |
|---|---|---|---|---|
| 2012/0169240 A1* | 7/2012 | Macfarlane | ............ | H05B 45/38 |
| | | | | 323/210 |
| 2014/0165017 A1* | 6/2014 | Barnaby | ............... | G06F 30/398 |
| | | | | 716/112 |
| 2021/0305773 A1 | 9/2021 | Kondo et al. | | |

FOREIGN PATENT DOCUMENTS

| | | |
|---|---|---|
| JP | 2012206485 | 10/2012 |
| JP | 2018030319 | 3/2018 |
| JP | 2021150388 | 9/2021 |
| JP | 2021158160 | 10/2021 |

\* cited by examiner

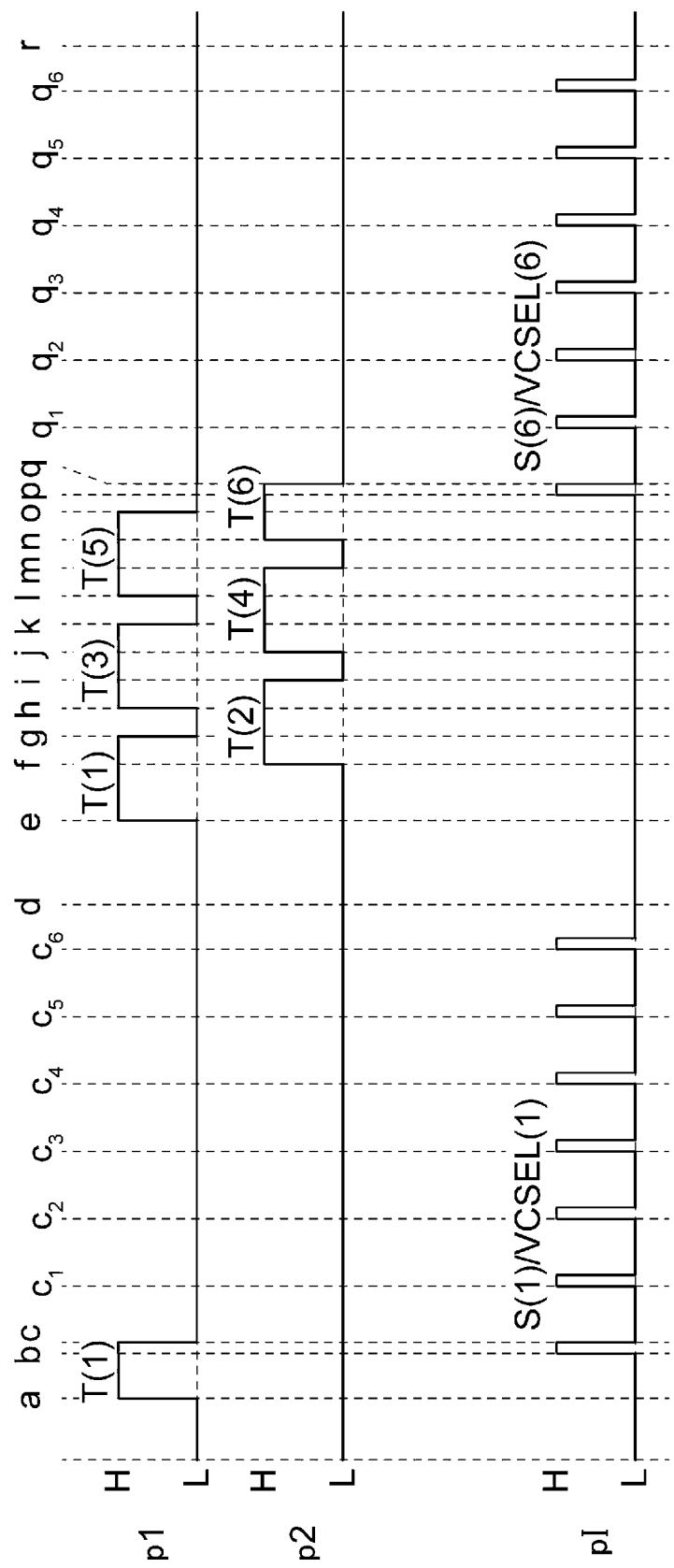

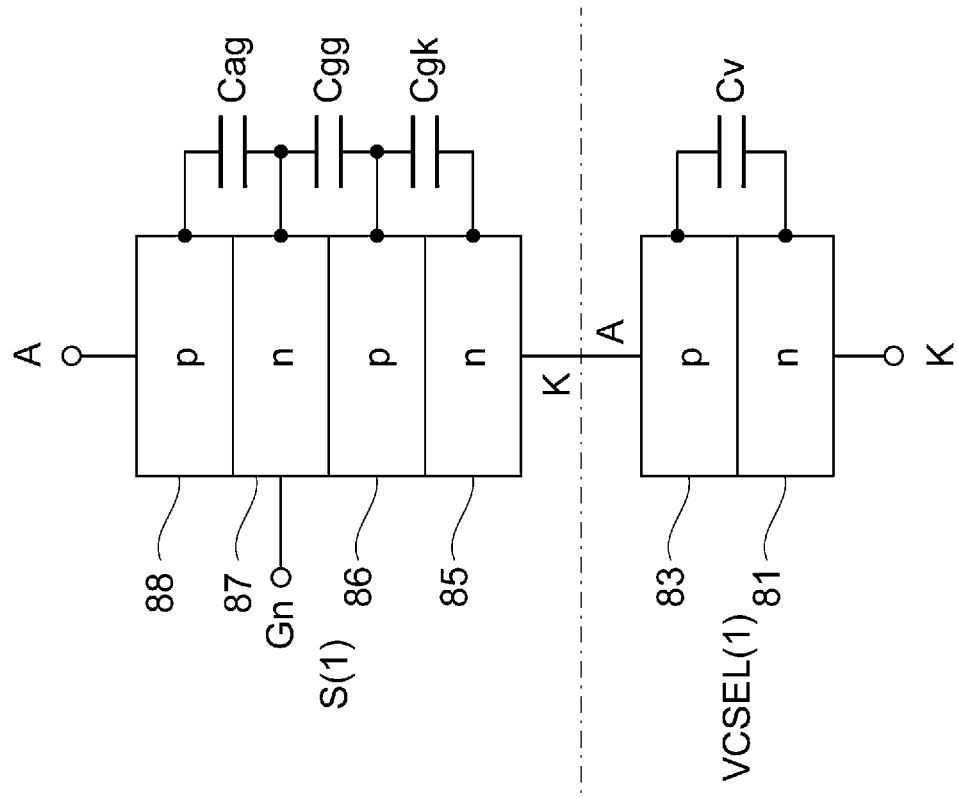
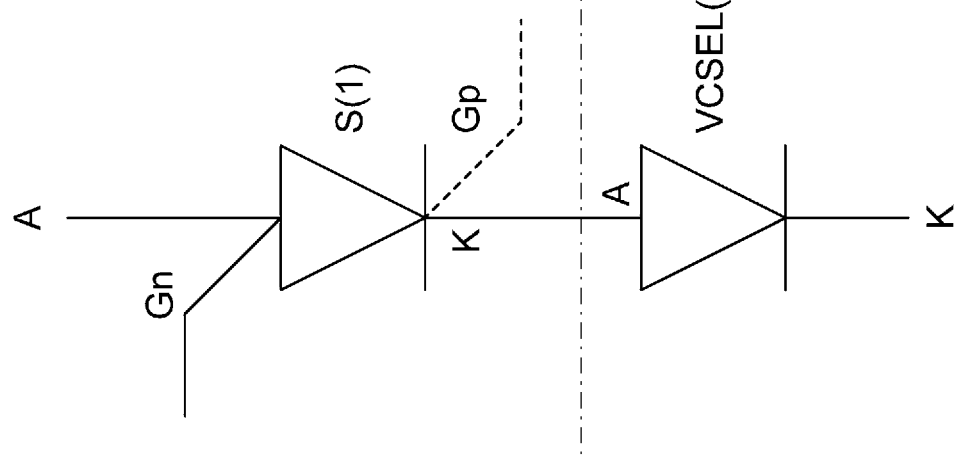

LIGHT SOURCE DEVICE, LIGHT-EMITTING UNIT, AND MEASUREMENT APPARATUS

CROSS-REFERENCE TO RELATED APPLICATIONS

This application is based on and claims priority under 35 USC 119 from Japanese Patent Application No. 2022-014979 filed Feb. 2, 2022.

BACKGROUND

(i) Technical Field

The present disclosure relates to a light source device, a light-emitting unit, and a measurement apparatus.

(ii) Related Art

Japanese Unexamined Patent Application Publication No. 2021-158160 discloses a light-emitting device including a light source and a controller. The light source includes plural light-emitting elements and plural drive elements. The plural drive elements are disposed to correspond to the plural light-emitting elements. When the drive elements are turned ON, they drive the corresponding light-emitting elements to emit light. The controller controls light emission of the plural light-emitting elements by switching between a sequential emission operation for causing the plural light-emitting elements to sequentially emit light and a simultaneous emission operation for causing the plural light-emitting elements to simultaneously emit light.

SUMMARY

The following type of light-emitting unit is known. The light-emitting unit includes a light-emitting element having a thyristor and turns ON the thyristor to cause the light-emitting element to emit light.

Aspects of non-limiting embodiments of the present disclosure relate to a light source device, a light-emitting unit, and a measurement apparatus which do not maintain an ON signal for turning ON a thyristor when it is not necessary to maintain it.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light source device including: a light-emitting section including a light-emitting element, the light-emitting element including a thyristor; a setter that sets the light-emitting element of the light-emitting section as a light-emitting element that emits light; and a controller that cancels an ON setting received from the setter after shifting the light-emitting element to a state in which the light-emitting element is able to emit light and that causes the light-emitting element to emit light multiple times by turning ON and OFF a light-emitting current, the light-emitting current causing the light-emitting element to emit light.

BRIEF DESCRIPTION OF THE DRAWINGS

Exemplary embodiments of the present disclosure will be described in detail based on the following figures, wherein:

FIG. 4 is a timing chart illustrating the operation of the light source device according to the first exemplary embodiment;

FIG. 7A is an equivalent circuit diagram of a light-emission control thyristor and a VCSEL;

FIG. 7B illustrates semiconductor layers and parasitic capacitors generated at pn junctions of the light-emission control thyristor and the VCSEL;

DETAILED DESCRIPTION

Exemplary embodiments of the disclosure will be described below in detail with reference to the accompanying drawings.

A description will be given of a light source device that does not maintain the ON state of a setter or the ON state of a thyristor provided for a light-emitting element when it is not necessary to maintain the ON state.

It has been thought that a light-emitting element is turned ON only when the ON state of a setter or the ON state of a thyristor provided for the light-emitting element is maintained. Maintaining the ON state of the setter and that of the thyristor may waste power which would not be consumed otherwise.

It has also been thought that, if a light-emitting signal for causing a light-emitting element to emit light is turned OFF ("L"), the ON state of the light-emitting element is canceled. If the light-emitting signal is turned ON ("H") when a light-emitting element is in the ON state or it is in a state in which it can shift to the ON state, another light-emitting element, which is not intended to be turned ON, may emit light due to malfunctioning.

First Exemplary Embodiment

Figure 1:
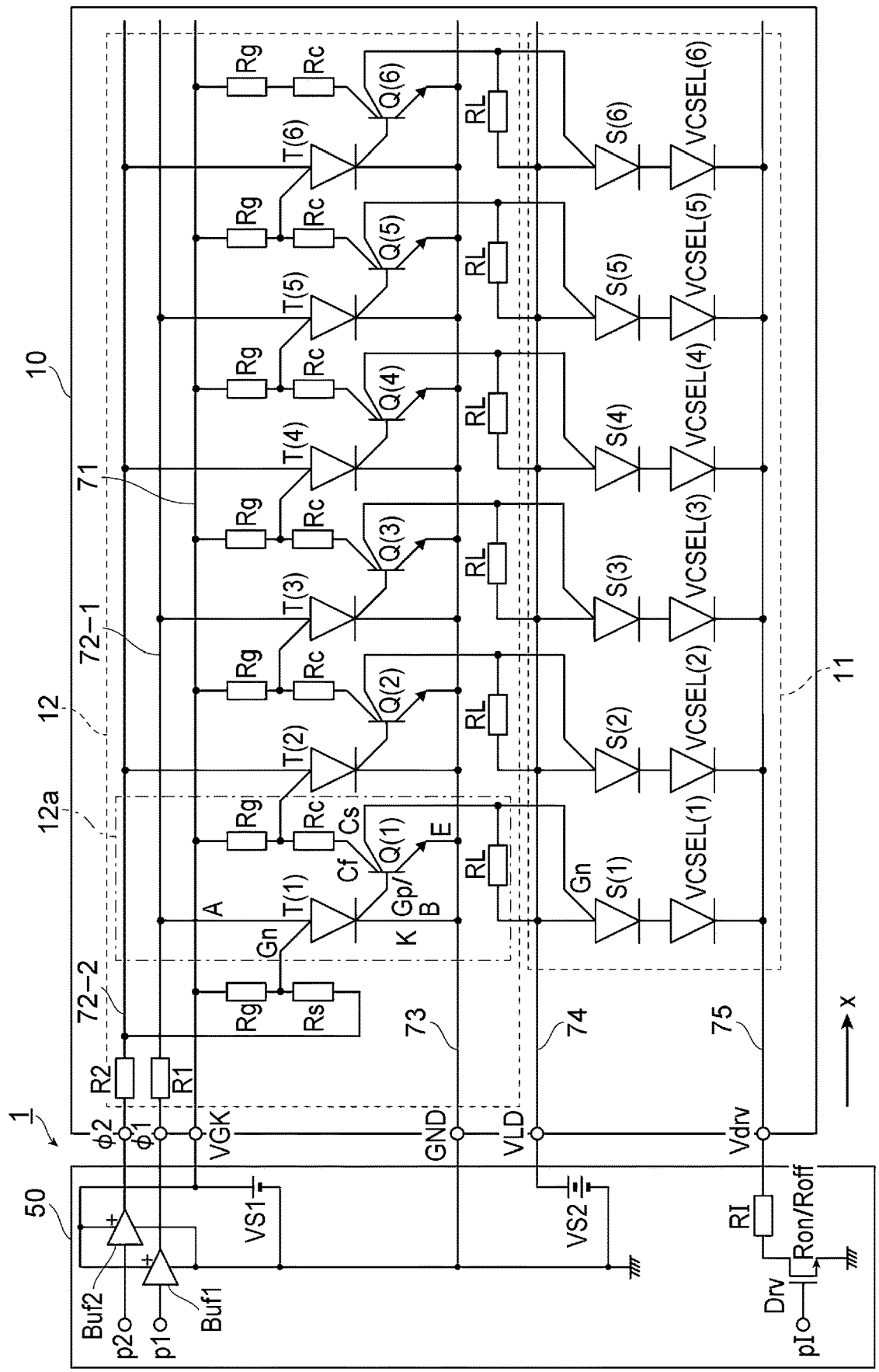
FIG. 1 illustrates a light source device according to a first exemplary embodiment.

FIG. 1 illustrates a light source device 1 according to a first exemplary embodiment. In FIG. 1, the right-side direction in the plane of the drawing is set to be a +x direction. In FIG. 1, thyristors and transistors are represented by symbols, and resistors are indicated by rectangles. Other drawings are also expressed in a similar manner.

The light source device 1 shown in FIG. 1 includes a light-emitting unit 10 and a controller 50.

(Light-Emitting Unit 10)

The light-emitting unit 10 includes a GND terminal, a VGK terminal, a ϕ1 terminal, a ϕ2 terminal, a VLD terminal, and a Vdrv terminal on one side (−x direction). GND represents a ground potential, which is a reference voltage. Hereinafter, the ground potential will be called the ground potential GND. VGK represents a power supply potential (hereinafter called the power supply potential VGK). VLD represents a light-emitting voltage (hereinafter called the light-emitting voltage VLD) used for supplying a light-emitting current. Vdrv represents a driver voltage (hereinafter called the driver voltage Vdrv) which is output from a driver that turns ON/OFF the light-emitting current.

The light-emitting unit 10 includes a light-emitting section 11 and a shifter 12.

The light-emitting section 11 includes multiple vertical cavity surface emitting lasers (VCSELs) and multiple light-emission control thyristors S. In FIG. 1, six VCSELs (VCSEL(1) through VCSEL(6)) and six light-emission control thyristors S (light-emission control thyristors S(1) through S(6)) are shown. Hereinafter, the VCSEL(1) through VCSEL(6) may collectively be called the VCSEL unless it is necessary to distinguish them from each other. Likewise, the light-emission control thyristors S(1) through S(6) may collectively be called the light-emission control thyristor S unless it is necessary to distinguish them from each other. The anode of the VCSEL and the cathode of the light-emission control thyristor S are connected to each other. That is, the VCSEL and the light-emission control thyristor S denoted by the same number are connected in series with each other. The six VCSELs and the six light-emission control thyristors S are arranged from one side (−x direction) to the other side (+x direction) of the light-emitting unit 10. The series-connected VCSEL and light-emission control thyristor S is an example of a light-emitting element including a thyristor. The light-emitting element may be an element including a thyristor whose pn junction emits light. Such an element is also an example of a light-emitting element including a thyristor.

The shifter 12 includes multiple shift thyristors T, coupling transistors Q, power supply line resistors Rg, current limiting resistors RL, and coupling resistors Rc. In FIG. 1, six shift thyristors T (shift thyristors T(1) through T(6)) and six coupling transistors Q (coupling transistors Q(1) through Q(6)) are shown. Hereinafter, the shift thyristors T(1) through T(6) may collectively be called the shift thyristor T unless it is necessary to distinguish them from each other. Likewise, the coupling transistors Q(1) through Q(6) may collectively be called the coupling transistor Q unless it is necessary to distinguish them from each other. The shifter 12 also includes six power supply line resistors Rg, six current limiting resistors RL, and six coupling resistors Rc, which are not denoted by numbers. A shift thyristor T, a coupling transistor Q, a power supply line resistor Rg, a current limiting resistor RL, and a coupling resistor Rc form a shift unit 12a. Six shift units 12a are arranged from one side (−x direction) to the other side (+x direction) of the shifter 12. The shifter 12 includes a power supply line resistor Rg and a start resistor Rs at the end of one side (−x direction). The light-emitting unit 10 also includes current limiting resistors R1 and R2.

In the shift unit 12a, the shift thyristor T and the coupling transistor Q are connected to each other. The coupling transistor Q in the shift unit 12a is connected to the light-emission control thyristor S of the light-emitting section 11. That is, the light-emission control thyristors S(1) through S(6) and the coupling transistors Q(1) through Q(6) are respectively connected to each other. In the example in FIG. 1, the six shift thyristors T, six coupling transistors Q, and six pairs of light-emission control thyristors S and VCSELs are shown. However, the numbers of shift thyristors T, coupling transistors Q, and pairs of light-emission control thyristors S and VCSELs may be other than six.

In the light-emitting unit 10, the VGK terminal is connected to a power supply line 71, the GND terminal is connected to a ground line 73, the ϕ1 terminal is connected to a shift signal line 72-1, the ϕ2 terminal is connected to a shift signal line 72-2, the VLD terminal is connected to a voltage supply line 74, and the Vdrv terminal is connected to a driver voltage line 75. The shift signal lines 72-1 and 72-2 will be called the shift signal line 72 unless it is necessary to distinguish them from each other.

The controller 50 includes buffers Buf1 and Buf2, power sources VS1 and VS2, a driver Drv, and a light-emitting current limiting resistor RI. The buffer Buf1 supplies a shift signal p1 to the ϕ1 terminal of the light-emitting unit 10. The buffer Buf2 supplies a shift signal p2 to the ϕ2 terminal of the light-emitting unit 10. The power source VS1 generates a power supply potential VGK and supplies it to the VGK terminal of the light-emitting unit 10. The power source VS1 also serves as a power source for the buffers Buf1 and Buf2. That is, the buffers Buf1 and Buf2 substantially output a voltage of the power source VS1 when the shift signals p1 and p2 are at a high (H) level, while they substantially output a voltage of the ground potential GND when the shift signals p1 and p2 are at a low (L) level. A dedicated power source, which is different from that generating the power supply potential VGK, may be used for the buffers Buf1 and Buf2.

The power source VS2 generates a light-emitting voltage VLD and supplies it to the VLD terminal of the light-emitting unit 10. The driver Drv uses an NMOS transistor, for example, as a driver element and is turned ON/OFF by a light-emitting signal pI applied to the gate of the NMOS transistor. The source of the NMOS transistor is grounded, while the drain thereof is connected to the Vdrv terminal via the light-emitting current limiting resistor RI. When the driver Drv is turned ON, it supplies the ground potential GND to the Vdrv terminal of the light-emitting unit 10. The light-emitting current is turned ON/OFF at the ground potential side (ground side), which quickens the rise time of the light-emitting current. The driver Drv has a preset ON-resistance Ron and a preset OFF-resistance Roff, which will be discussed later. The ON-resistance is the resistance when the driver Dry is ON, while the OFF-resistance is the resistance when the driver Dry is OFF. The OFF-resistance may be formed by using the structure of the NMOS transistor or by controlling the gate voltage of the NMOS transistor. Alternatively, a resistor having a smaller resistance than that when the NMOS transistor is OFF may be provided between the source and the drain of the NMOS transistor. By using this resistor, the OFF-resistance may be formed. With this approach, the OFF-resistance Roff can be set simply. Instead of an NMOS transistor, another element, such as an insulated gate bipolar transistor (IGBT), may be used. An NMOS transistor and an IGBT are examples of a driver element.

The relationship between the elements of the light-emitting unit 10 will be explained below by using the enlarged view of FIG. 2A. The light-emission control thyristor S, the shift thyristor T, and the coupling transistor Q may simply be called the light-emitting control thyristor, shift thyristor, and coupling transistor, respectively, without using the corresponding alphabetical symbols. The light-emission control thyristor S and the shift thyristor T may collectively be called the thyristor when it is not necessary to distinguish them from each other.

(Operations of Shift Thyristor, Coupling Transistor, VCSEL, and Light-Emission Control Thyristor)

The basic operation of the light-emitting unit 10 will be explained below.

Each of the shift thyristor and the light-emission control thyristor is an npnp thyristor. Each thyristor has an n-type cathode K (hereinafter simply called the cathode K), a p-type gate Gp (hereinafter simply called the p-gate Gp), an n-type gate Gn (hereinafter simply called the n-gate Gn), and a p-type anode A (hereinafter simply called the anode A). The light-emission control thyristor S does not use the p-gate Gp for a control operation, and the p-gate Gp is not indicated in the drawings.

The coupling transistor is a multi-collector npn bipolar transistor. The coupling transistor has an n-type emitter E (hereinafter simply called the emitter E), a p-type base B (hereinafter simply called the base B), and n-type collectors Cf and Cs (hereinafter simply called the collectors Cf and Cs).

The above-described alphabetical symbols for the thyristor are used for all the thyristors, and the above-described alphabetical symbols for the coupling transistor are used for all the coupling transistors. Bipolar transistors forming a thyristor discussed below are also represented by these symbols. The thyristor is constituted by a combination of a single-collector npn bipolar transistor and a single-collector pnp bipolar transistor, which will be discussed later, and is thus also represented by an emitter E, a base B, and a collector C. Hereinafter, the anode, cathode, n-gate, p-gate, emitter, base, and collector will be called the anode A, cathode K, n-gate Gn, p-gate Gp, emitter E, base B, and collector C, respectively, even when these alphabetical symbols are not shown in the drawing.

The shift thyristor T, the coupling transistor Q, and a set of the light-emission control thyristor S and the VCSEL are formed by a III-V compound semiconductor, such as GaAs. The forward voltage (diffusion potential) Vd at the junction of this compound semiconductor is set to be 1.5 V, while the saturation voltage Vc of a bipolar transistor formed by the compound semiconductor is set to be 0.3 V. The ground potential GND is set to be 0 V, and the power supply potential VGK and the light-emitting voltage VLD are set to be 5 V. For the shift signals p1 and p2 and the light-emitting signal pI, the L level is 0 V ("L" (0 V)) and the H level is 5 V ("H" (5 V)). When the light-emitting signal pI is made to have "L" (0 V), the driver Dry is turned OFF. When the light-emitting signal pI is made to have "H" (5 V), the driver Dry is turned ON.

Figure 2A:
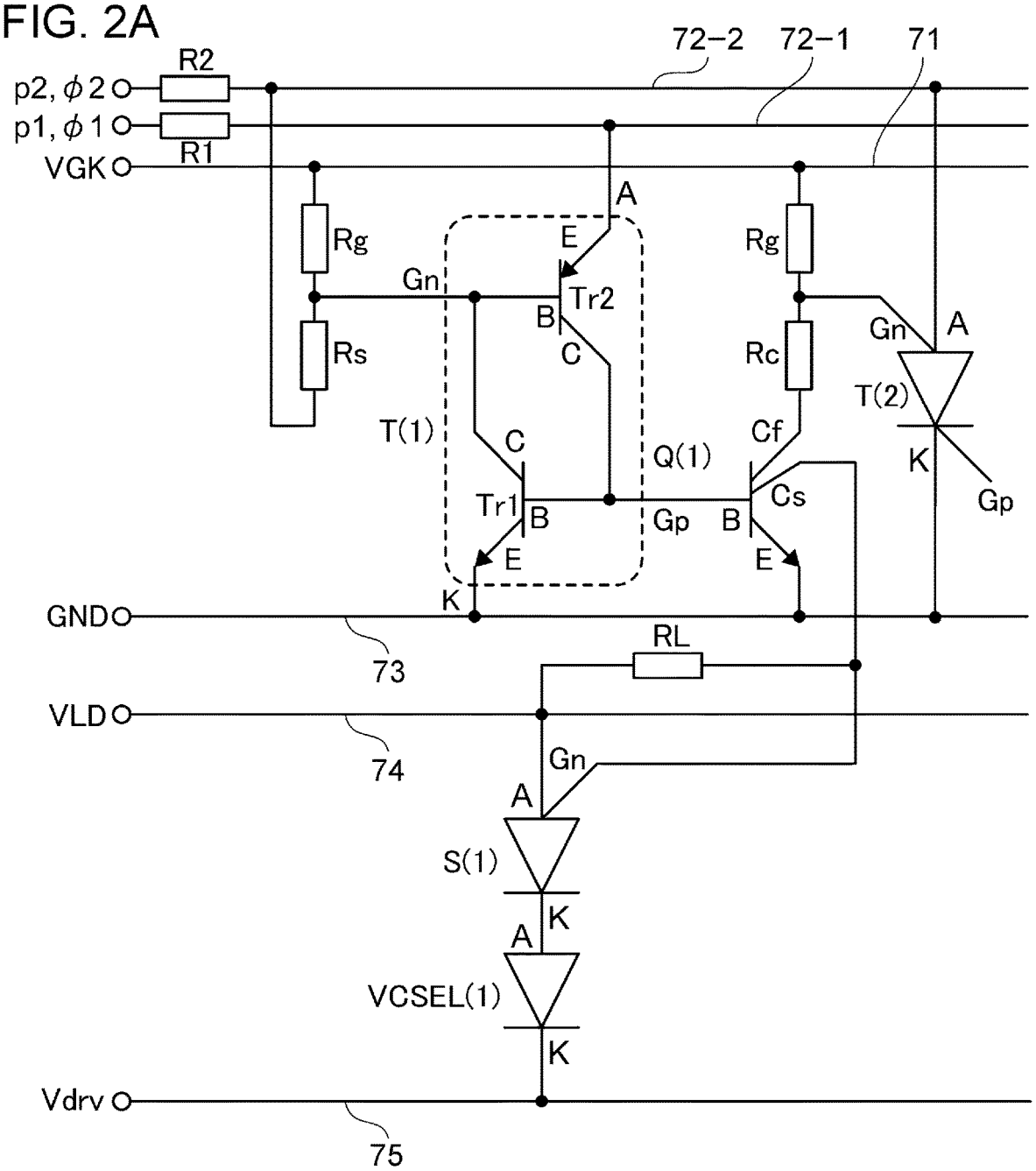
FIG. 2A is an equivalent circuit diagram for explaining the operation of a light-emitting unit by using a shift thyristor, a coupling transistor, and a set of a light-emission control thyristor and a vertical cavity surface emitting laser (VCSEL)
Figure 2B:
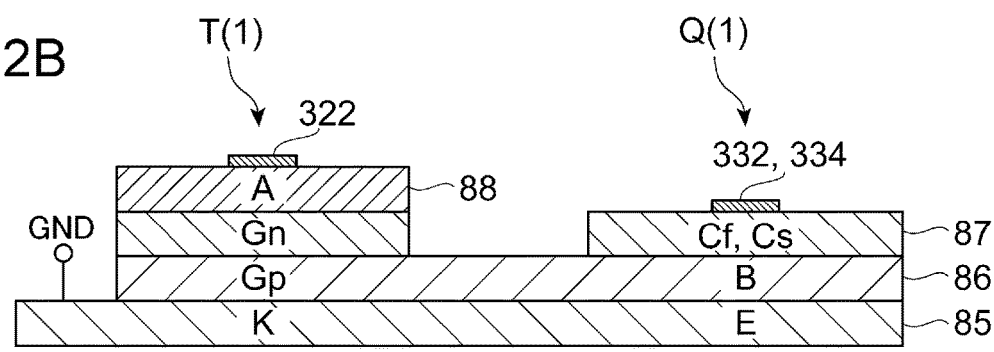
FIG. 2B is a partial sectional view illustrating the shift thyristor and the coupling transistor shown in FIG. 2A.

FIG. 2A is an equivalent circuit diagram for explaining the operation of the light-emitting unit 10 by using the shift thyristor T(1), the coupling transistor Q(1), and a set of the light-emission control thyristor S(1) and the VCSEL(1). FIG. 2B is a sectional view illustrating the shift thyristor T(1) and the coupling transistor Q(1) shown in FIG. 2A. In FIG. 2A, the shift thyristor T(2) is also shown.

As shown in FIG. 2A, the shift thyristor T(1) is constituted by a combination of an npn bipolar transistor Tr1 (hereinafter called the npn transistor Tr1) and a pnp bipolar transistor Tr2 (hereinafter called the pnp transistor Tr2). The base B of the npn transistor Tr1 is connected to the collector C of the pnp transistor Tr2. The collector C of the npn transistor Tr1 is connected to the base B of the pnp transistor Tr2. The emitter E of the npn transistor Tr1 serves as the cathode K of the shift thyristor T(1). The collector C of the npn transistor Tr1 (base B of the pnp transistor Tr2) serves as the n-gate Gn of the shift thyristor T(1). The collector C of the pnp transistor Tr2 (base B of the npn transistor Tr1) serves as the p-gate Gp of the shift thyristor T(1). The emitter E of the pnp transistor Tr2 serves as the anode A of the shift thyristor T(1). The emitter E of the npn transistor Tr1, which serves as the cathode K of the shift thyristor T(1), is connected to the ground line 73 connected to the GND terminal to which the ground potential GND is supplied. The emitter E of the pnp transistor Tr2, which serves as the anode A of the shift thyristor T(1), is connected to the shift signal line 72-1 connected to the φ1 terminal. The n-gate Gn is connected to a node between the start resistor Rs and the power supply line resistor Rg connected in series with each other. The end of the start resistor Rs, which is not the end connected to the power supply line resistor Rg, is connected to the shift signal line 72-2 connected to the φ2 terminal. The end of the power supply line resistor Rg, which is not the end connected to the start resistor Rs, is connected to the power supply line 71 connected to the VGK terminal to which the power supply potential VGK is supplied. The shift signal p1 is supplied to the φ1 terminal, while the shift signal p2 is supplied to the φ2 terminal.

Regarding the coupling transistor Q(1), which is an npn transistor, the base B is connected to the p-gate Gp of the shift thyristor T(1) (the base B of the npn transistor Tr1 and the collector C of the pnp transistor Tr2), and the emitter E is connected to the ground line 73. The collector Cf is connected via the series-connected coupling resistor Rc and power supply line resistor Rg to the power supply line 71 to which the power supply potential VGK is supplied. The node between the coupling resistor Rc and the power supply line resistor Rg is connected to the n-gate Gn of the shift thyristor T(2).

The npn transistor Tr1 of the shift thyristor T(1) and the coupling transistor Q(1) form a current mirror circuit. That is, a current proportional to a current flowing through the npn transistor Tr1 flows through the coupling transistor Q(1).

The collector Cs of the coupling transistor Q(1) is connected to the n-gate Gn of the light-emission control thyristor S(1) and is also connected via the current limiting resistor RL to the voltage supply line 74 connected to the VLD terminal to which the light-emitting voltage VLD is supplied.

As stated above, the VCSEL(1) and the light-emission control thyristor S(1) are connected in series with each other. That is, the anode A of the VCSEL(1) and the cathode K of the light-emission control thyristor S(1) are connected to each other. The anode A of the light-emission control thyristor S(1) is connected to the voltage supply line 74. The cathode K of the VCSEL(1) is connected to the driver voltage line 75 connected to the Vdry terminal to which the driver voltage Vdry is supplied.

The anode A of the shift thyristor T(2) is connected to the shift signal line 72-2 connected to the φ2 terminal. As shown in FIG. 1, the anodes A of the odd-numbered shift thyristors T are connected to the shift signal line 72-1, while the anodes A of the even-numbered shift thyristors T are connected to the shift signal line 72-2. Except for the connection relationship of the shift thyristors T to the shift signal lines 72-1 and 72-2, the connection relationship between the shift thyristor T(2), coupling transistor Q(2), light-emission control thyristor S(2), and VCSEL(2) through the connection relationship between the shift thyristor T(6), coupling transistor Q(6), light-emission control thyristor S(6), and VCSEL(6) are similar to that of the shift thyristor T(1), coupling transistor Q(1), light-emission control thyristor S(1), and VCSEL(1). Hereinafter, the shift signals p1 and p2 may also be indicated by the shift signals p1(φ1) and p2(φ2), respectively.

The operation of the shift thyristor T(1) will first be discussed below.

The power supply line 71 is set at the power supply potential VGK (5 V), and the ground line 73 is set at the ground potential GND (0 V). The shift signals p1(φ1) and p2(φ2) are at "L" (0 V). At this time, the npn transistor Tr1 and the pnp transistor Tr2 forming the shift thyristor T(1) are in the OFF state. The n-gate Gn of the shift thyristor T(1) is connected to the node between the start resistor Rs and the power supply line resistor Rg connected in series with each other. The end of the start resistor Rs, which is not the end connected to the power supply line resistor Rg, is connected to the shift signal line 72-2 at "L" (0 V). The end of the power supply line resistor Rg, which is not the end connected to the start resistor Rs, is connected to the power supply line 71 at 5 V. Accordingly, the n-gate Gn is at the voltage obtained by distributing 5 V (voltage difference) between the start resistor Rs and the power supply line resistor Rg. If the voltage ratio between the start resistor Rs and the power supply line resistor Rg is 1:5, for example, the voltage at the n-gate Gn is 0.83 V. The light-emitting signal pI is "L" (0 V) and the driver Dry is OFF. Accordingly, the driver voltage Vdry is not supplied to the driver voltage line 75. The above-described state is the initial state.

When the shift signal p1(φ1) is changed from "L" (0 V) to "H" (5 V), the voltage difference (4.17 V) between the emitter E ("H" (5 V)) and the base B (p-gate Gp) (0.83 V) of the pnp transistor Tr2 exceeds the forward voltage Vd (1.5 V), and the junction between the emitter E and the base B is forward-biased. The pnp transistor Tr2 is thus shifted from the OFF state to the ON state. Then, the voltage at the collector C of the pnp transistor Tr2 (the base B of the npn transistor Tr1) results in 4.7 V obtained by subtracting the saturation voltage Vc (0.3 V) from the voltage at the emitter E ("H" (5 V)). The voltage difference (4.7 V) between the emitter E (0 V) and the base B (4.7 V) of the npn transistor Tr1 exceeds the forward voltage Vd (1.5 V). The junction between the emitter E and the base B is thus forward-biased, and the npn transistor Tr1 is shifted from the OFF state to the ON state. Since both of the npn transistor Tr1 and the pnp transistor Tr2 of the shift thyristor T(1) are turned ON, the shift thyristor T(1) is shifted from the OFF state to the ON state. "The shift thyristor T is shifted from the OFF state to the ON state" may also be called "the shift thyristor T is turned ON". "The shift thyristor T is shifted from the ON state to the OFF state" may also be called "the shift thyristor T is turned OFF".

When the shift signal p1(φ1) is shifted from "L" (0 V) to "H" (5 V) in the initial state, the shift thyristor T(1) is turned ON and is shifted from the OFF state to the ON state. The state in which the shift thyristor T can be turned ON when the anode A is made to have "H" (5 V) will be called "the shift thyristor T is in a state in which it can shift to the ON state". This also applies to other elements.

When the shift thyristor T(1) is turned ON, the voltage at the n-gate Gn of the shift thyristor T(1) is changed to 0.3 V, which is the saturation voltage Vc. The voltage at the anode A is determined by the total voltage of the forward voltage Vd and the saturation voltage Vc (Vd+Vc) and by a voltage drop due to the internal resistance of the shift thyristor T. In this example, the voltage at the anode A is assumed to be 1.9 V. That is, when the shift thyristor T(1) is turned ON, the voltage of the shift signal line 72-1 is shifted from 5 V to 1.9 V. Then, the voltage at the p-gate Gp of the shift thyristor T(1) is changed to 1.6 V.

As described above, the shift thyristor T(1) is turned ON when the voltage at the n-gate Gn becomes lower than the voltage at the anode A by a value equal to the forward voltage Vd (1.5 V) or greater. The shift thyristor T(1) is turned OFF when the voltage of the shift signal line 72-1 (the voltage across the anode A and the cathode K) becomes lower than the above-described value, that is, 1.9 V. For example, when the anode A is made to have "L" (0 V), the voltage difference between the anode A and the cathode K is changed to 0 V, and the shift thyristor T(1) is turned OFF. On the other hand, when the voltage of the shift signal line 72-1 (voltage difference between the anode A and the cathode K) is 1.9 V or greater, the ON state of the shift thyristor T(1) is maintained. Hence, 1.9 V will be called the holding voltage. Even with the application of the holding voltage, if a current for holding the ON state of the shift thyristor T(1) is not supplied, the ON state of the shift thyristor T(1) is not maintained. The current for holding the ON state will be called the holding current.

Next, the operation of the coupling transistor Q(1) will be explained below.

When the shift thyristor T(1) is in the OFF state, the npn transistor Tr1 is also in the OFF state. Accordingly, the coupling transistor Q(1) is also in the OFF state. At this time, the emitter E of the coupling transistor Q(1) is set at the ground potential GND (0 V). The voltage at the collector Cf becomes equal to the power supply potential VGK (5 V) via the series-connected power supply line resistor Rg and coupling resistor Rc. The voltage at the collector Cs becomes equal to the light-emitting voltage VLD (5 V) via the current limiting resistor RL.

When the shift thyristor T(1) is turned ON, that is, when the npn transistor Tr1 enters the ON state, the p-gate Gp of the shift thyristor T(1) is changed to 1.6 V, as discussed above. Since the base B of the coupling transistor Q(1) is connected to the p-gate Gp of the shift thyristor T(1), the voltage at the junction between the emitter E and the base B becomes greater than or equal to the forward voltage Vd (1.5 V). That is, the junction between the emitter E and the base B is forward-biased, and the coupling transistor Q(1) is shifted from the OFF state to the ON state. Then, the voltage at the collector Cf becomes equal to the saturation voltage Vc (0.3 V). The voltage at the collector Cs will be discussed later. The voltage at the node between the power supply line resistor Rg and the coupling resistor Rc (n-gate Gn of the shift thyristor T(2)) is determined as follows. The voltage difference between the voltage (5 V) of the power supply line 71 and the voltage (0.3 V) of the collector Cf is 4.7 V. The voltage obtained by distributing 4.7 V between the power supply line resistor Rg and the coupling resistor Rc is the voltage at the node between the power supply line resistor Rg and the coupling resistor Rc. If the voltage ratio between the power supply line resistor Rg and the coupling resistor Rc is 5:1, for example, the voltage at the node between the power supply line resistor Rg and the coupling resistor Rc (n-gate Gn of the shift thyristor T(2)) is 1.08 V.

The anode A of the shift thyristor T(2) is connected to the shift signal line 72-2 to which the shift signal p2(φ2) is supplied. Since the shift signal p2(φ2) is at "L" (0 V), the shift thyristor T(2) is not turned ON. When the shift signal p2(φ2) is changed from "L" (0 V) to "H" (5 V), the voltage at the anode A of the shift thyristor T(2) is changed to "H" (5 V). The voltage difference (3.92 V) between the anode A and the n-gate Gn (1.08 V) becomes higher than the forward voltage Vd (1.5 V). That is, the junction between the n-gate Gn and the anode A is forward-biased, and the shift thyristor T(2) is turned ON. In this manner, multiple elements are provided and the element which is turned ON is sequentially shifted. This operation is called a shift operation. In the exemplary embodiments of the specification, elements to be turned ON or OFF are shift elements. Using the shift thyristors T as the shift elements makes it easy to perform this shift operation.

The operation of the light-emission control thyristor S(1) and the VCSEL(1) will be discussed below.

The collector Cs of the coupling transistor Q(1) is connected to the n-gate Gn of the light-emission control thyristor S(1). When the coupling transistor Q(1) is turned ON, the pn junction between the anode A and the n-gate Gn of the light-emission control thyristor S(1) is forward-biased. The collector Cs of the coupling transistor Q(1) draws a current from the light-emitting voltage VLD via the pn junction between the anode A and the n-gate Gn of the light-emission control thyristor S(1), so that the voltage at the collector Cs results in substantially 3.5 V, which is obtained by subtracting the forward voltage Vd (1.5 V) from the light-emitting voltage VLD (5 V). Then, the driver Dry is turned ON, and when the driver voltage Vdry is changed to the GND voltage (0 V), the cathode K of the VCSEL(1) is changed to 0 V. The voltage difference (5 V) between the light-emitting voltage VLD (5 V) and the driver voltage Vdry (0 V) is thus applied to between the anode A of the light-emission control thyristor S(1) and the cathode K of the VCSEL(1). This turns ON the light-emission control thyristor S(1), causing a current to flow through the light-emission control thyristor S(1) and the VCSEL(1) connected in series with each other. The VCSEL(1) thus emits light. The state in which the coupling transistor Q(1) is turned ON and the n-gate Gn of the light-emission control thyristor S(1) is at 3.5 V is a state in which the VCSEL(1) emits light when the driver Dry is turned ON. Hence, the state in which the coupling transistor Q(1) is turned ON and the junction between the anode A and the n-gate Gn of the light-emission control thyristor S(1) is forward-biased to 3.5 V will be called a state in which the VCSEL(1) can emit light. As the name suggests, the light-emission control thyristor S controls the light emission of the VCSEL by using the potential of the n-gate Gn. The shift thyristor T and the coupling transistor Q of the shifter 12 are turned ON and the anode A and the n-gate Gn of the light-emission control thyristor S is forward-biased. This state will be called "an ON state is received from the shifter 12". The shift thyristor T and the coupling transistor Q of the shifter 12 are turned OFF. This state will be called "the ON setting received from the shifter 12 is canceled". The coupling transistor Q is turned ON and the saturation voltage Vc (0.3 V in this example) is supplied from the collector Cs to the n-gate Gn of the light-emission control thyristor S. In this state, the saturation voltage Vc will be called an ON signal. The ON signal drives the light-emission control thyristor S to be in a state in which the VCSEL can emit light.

In the initial state, the power supply line 71 is at the power supply potential VGK (5 V), the ground line 73 is at the ground potential GND (0 V), the shift signals p1(φ1) and p2(φ2) are at "L" (0 V), the driver Dry is OFF, and the driver voltage Vdry is not supplied to the driver voltage line 75. In the initial state, the shift thyristor T(1) enters a state in which it can shift to the ON state. Then, when the shift signal p1(φ1) (shift signal line 72-1) is changed from "L" (0 V) to "H" (5 V), the shift thyristor T(1) is turned ON and shifts from the OFF state to the ON state. Then, the coupling transistor Q(1) is shifted from the OFF state to the ON state. Then, the anode A and the n-gate Gn of the light-emission control thyristor S(1) is forward-biased and the VCSEL(1) enters a state in which it can emit light. When the coupling transistor Q(1) is in the ON state, the shift thyristor T(2) enters a state in which it can shift to the ON state. When the shift signal p2(φ2) (shift signal line 72-2) is changed from "L" (0 V) to "H" (5 V), the shift thyristor T(2) is turned ON. When the shift signal p1(φ1) (shift signal line 72-1) is changed from "H" (5 V) to "L" (0 V), the shift thyristor T(1) is turned OFF since the cathode K and the anode A are changed to "L" (0 V). The other shift thyristors T, coupling transistors Q, light-emission control thyristors S, and VCSELs are operated in a similar manner.

Figure 3A:
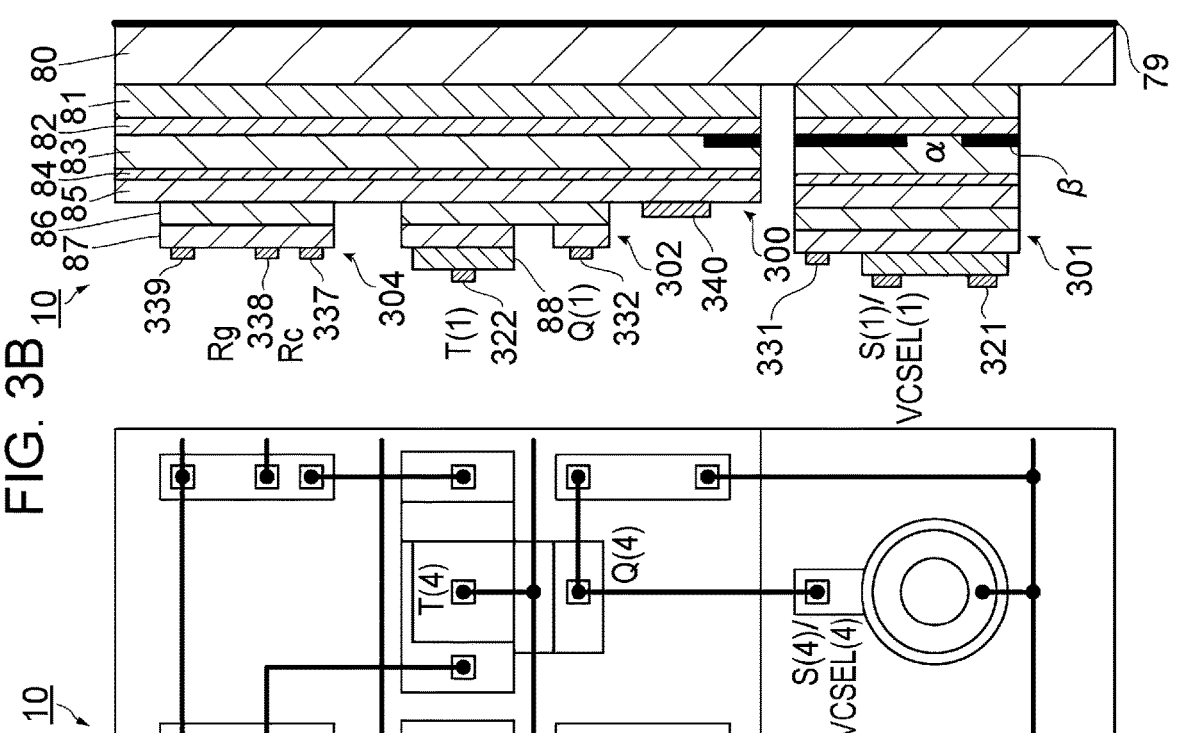
FIG. 3A illustrates the layout of the light-emitting unit.
Figure 3B:
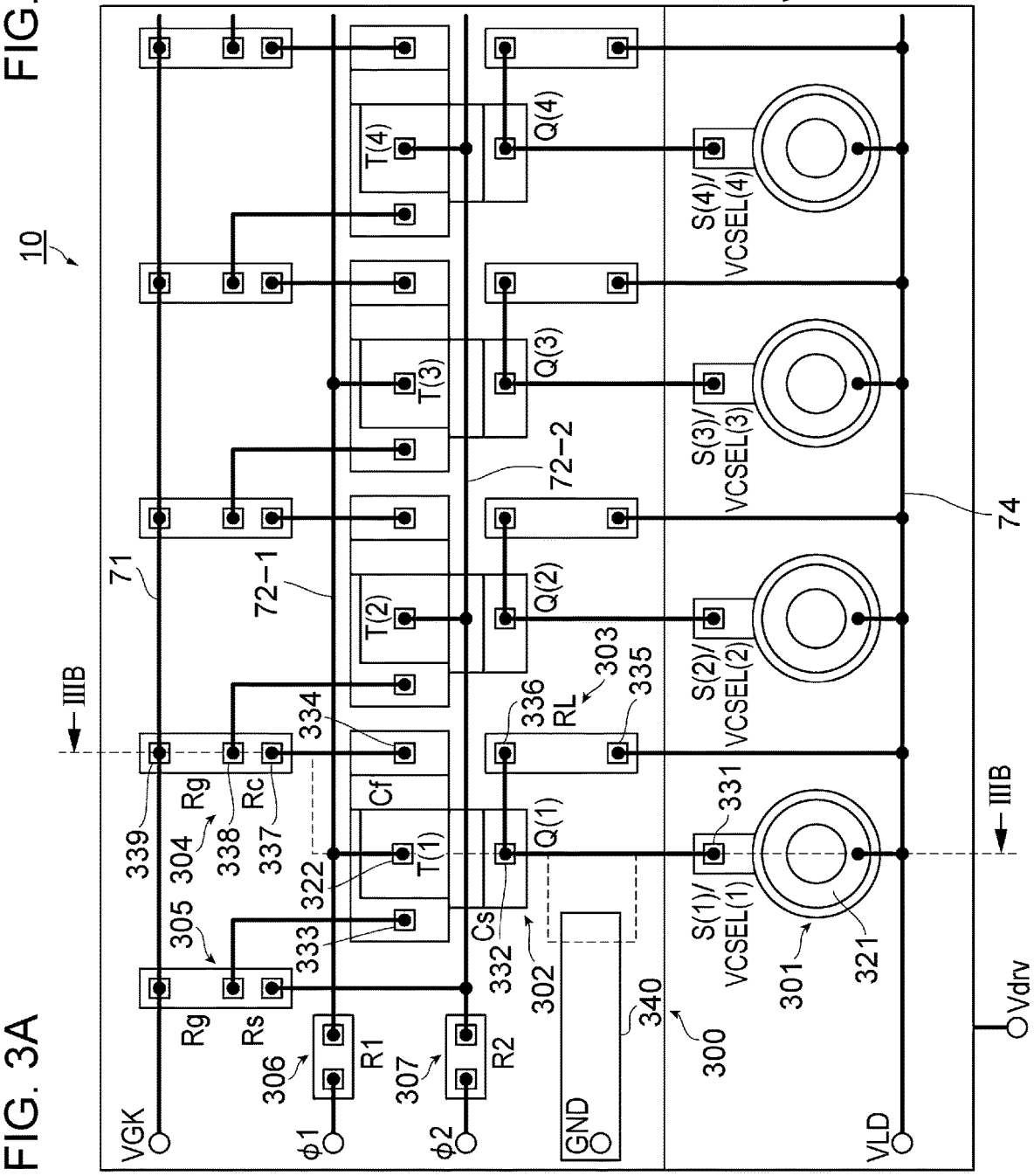
FIG. 3B is a sectional view taken along line IIIB-IIIB in FIG. 3A.

As shown in FIG. 2B, the light-emitting unit 10 is constituted by multiple semiconductor layers stacked on each other (see FIG. 3B). FIG. 2B illustrates multilayers forming part of the light-emitting unit 10, that is, an n-type semiconductor layer 85, a p-type semiconductor layer 86, an n-type semiconductor layer 87, and a p-type semiconductor layer 88, forming the shift thyristor T(1) and the coupling transistor Q(1). The shift thyristor T(1) uses the n-type semiconductor layer 85 as the cathode K, the p-type semiconductor layer 86 as the p-gate Gp, the n-type semiconductor layer 87 as the n-gate Gn, and the p-type semiconductor layer 88 as the anode A. The coupling transistor Q(1) uses the n-type semiconductor layer 85 as the emitter E, the p-type semiconductor layer 86 as the base B, and the n-type semiconductor layer 87 as the collectors Cf and Cs. The cathode K of the shift thyristor T(1) and the emitter E of the coupling transistor Q(1) are electrically connected to each other via the n-type semiconductor layer 85. Likewise, the p-gate Gp of the shift thyristor T(1) and the base B of the coupling transistor Q(1) are electrically connected to each other via the p-type semiconductor layer 86. Although the n-gate Gn of the shift thyristor T(1) and the collectors Cf and Cs of the coupling transistor Q(1) form the n-type semiconductor layer 87, they are separated from each other. The other shift thyristors T and coupling transistors Q are formed in a similar manner.

FIGS. 3A and 3B are respectively a plan view and a sectional view of the light-emitting unit 10. FIG. 3A illustrates the layout of the light-emitting unit 10. FIG. 3B is a sectional view taken along line IIIB-IIIB in FIG. 3A. In FIG. 3A, the shift thyristors T(1) through T(4), coupling transistors Q(1) through Q(4), light-emission control thyristors S(1) through S(4), and VCSEL(1) through VCSEL(4) are mainly shown. In FIG. 3B, the cross sections of the light-emission control thyristor S(1), VCSEL(1), shift thyristor T(1), coupling transistor Q(1), and coupling resistor Rc and power supply line resistor Rg connected to the coupling transistor Q(1) are shown.

As shown in FIG. 3B, the light-emitting unit 10 is constituted by an n-type semiconductor substrate 80 and multilayers stacked on the n-type semiconductor substrate 80. The multilayers are constituted by an n-type semiconductor layer 81, an active layer 82, a p-type semiconductor layer 83, a tunnel junction layer 84, an n-type semiconductor layer 85, a p-type semiconductor layer 86, an n-type semiconductor layer 87, and a p-type semiconductor layer 88. The n-type semiconductor substrate 80 is an example of a substrate. Elements, such as the shift thyristor T, coupling transistor Q, light-emission control thyristor S, VCSEL, are constituted by plural islands, which are separated from each other by partially removing some semiconductor layers by etching. An island may also be called a mesa. Etching performed to form an island (mesa) may also be called mesa etching. Islands (islands 300 and 301 through 307) will be explained by mainly referring to the island 301 including the light-emission control thyristor S(1) and the VCSEL(1) and the island 302 including the shift thyristor T(1) and the coupling transistor Q(1).

The island 300 is a region where the shifter 12 (see FIG. 1), such as the shift thyristor T(1) and the coupling transistor Q(1), is disposed. The n-type semiconductor layer 81, active layer 82, p-type semiconductor layer 83, tunnel junction layer 84, and n-type semiconductor layer 85 entirely remain on the n-type semiconductor substrate 80.

In the island 301, the VCSEL(1) and the light-emission control thyristor S(1) are stacked on each other. The shift thyristor T(1) and the coupling transistor Q(1) shown in FIG. 2B are disposed in the island 302. The current limiting resistor RL is disposed in the island 303. The power supply line resistor Rg and the coupling resistor Rc are disposed in the island 304. The power supply line resistor Rg and the start resistor Rs are disposed in the island 305. The current limiting resistor R1 is disposed in the island 306. The current limiting resistor R2 is disposed in the island 307.

The layout and the sectional area of the light-emitting unit 10 will be discussed below with reference to FIGS. 3A and 3B.

The n-type semiconductor layer 81, active layer 82, p-type semiconductor layer 83, tunnel junction layer 84, and n-type semiconductor layer 85, p-type semiconductor layer 86, n-type semiconductor layer 87, and p-type semiconductor layer 88 around the island 301 are removed by etching. A p-ohmic electrode 321, which is likely to easily ohmic-contact a p-type semiconductor layer, is provided on the p-type semiconductor layer 88. An n-ohmic electrode 331, which is likely to easily ohmic-contact an n-type semiconductor layer, is provided on the n-type semiconductor layer 87 which is exposed by removing the p-type semiconductor layer 88. The VCSEL(1) uses the n-type semiconductor layer 81 as the cathode K (see FIG. 2A), the active layer 82 as an active layer, the p-type semiconductor layer 83 as the anode A. The light-emission control thyristor S(1) uses the n-type semiconductor layer 85 as the cathode K, the p-type semiconductor layer 86 as the p-gate Gp (p-gate layer), the n-type semiconductor layer 87 as the n-gate Gn (n-gate layer), and the n-type semiconductor layer 88 as the anode A. The n-ohmic electrode 331 is used as the n-gate Gn of the light-emission control thyristor S(1).

As shown in FIG. 3B, the VCSEL(1) is disposed on the n-type semiconductor substrate 80, and the light-emission control thyristor S(1) is disposed on the VCSEL(1) with the tunnel junction layer 84 interposed therebetween. The tunnel junction layer 84 is provided to make it difficult to cause a situation where a current does not flow between the p-type semiconductor layer 83 of the VCSEL(1) and the n-type semiconductor layer 85 of the light-emission control thyristor S(1) due to reverse biasing therebetween. The tunnel junction layer 84 is a junction between an $n^{++}$ layer highly doped with an n-type impurity and a $p^{++}$ layer highly doped with a p-type impurity. A current flows through the tunnel junction layer 84 due to the tunnel effect even when the p-type semiconductor layer 83 and the n-type semiconductor layer 85 are reverse-biased.

The island 301 is formed cylindrically, except for a region where the n-ohmic electrode 331 is provided. The p-ohmic electrode 321, which is formed in a ring-like shape, is disposed on the p-type semiconductor layer 88 of the cylindrical island 301. Part of the p-type semiconductor layer 83, which is exposed by etching, is oxidized from the peripheral portion of the cylindrical p-type semiconductor layer 803 and serves as a current blocking portion β. The current blocking portion β is formed in a ring-like shape where a current is less likely to flow. The center of the cylindrical p-type semiconductor layer 83, which is not oxidized, serves as a current passing portion α where a current is more likely to flow. Then, light is output from a portion surrounded by the ring-like p-ohmic electrode 321. The current blocking portion β is formed in the following manner. An AlAs layer or an AlGaAs layer having a high Al density is provided in the p-type semiconductor layer 83. Then, the exposed p-type semiconductor layer 83 is oxidized from the peripheral portion, that is, Al is oxidized, thereby forming the current blocking portion β. The peripheral portion of the VCSEL(1) suffers from many defects due to etching and are thus likely to cause the occurrence of non-radiative recombination. The provision of the current blocking portion β makes it less likely to consume power which would be used for non-radiative recombination, thereby enhancing power saving and light emission efficiency. The light emission efficiency is represented by the amount of light that can be emitted per unit power.

In the example shown in FIGS. 3A and 3B, the VCSEL(1) emits light, which passes through the light-emission control thyristor S(1) and is output. In the island 301, the portion of the light-emission control thyristor S(1) (tunnel junction layer 84 and semiconductor layers 85 through 88) where light passes through may be removed. In this case, the light-emission control thyristor S(1) is formed in a doughnut shape. With this arrangement, light emitted from the VCSEL (1) is less likely to be absorbed in the light-emission control thyristor S(1) and the amount of light is less likely to be decreased.

The p-type semiconductor layer 86, n-type semiconductor layer 87, and p-type semiconductor layer 88 around the island 302 are removed by etching (see FIG. 2B). A p-ohmic electrode 322 is provided on the p-type semiconductor layer 88. The p-ohmic electrode 322 is an electrode (anode A electrode) which is connected to the anode A of the shift thyristor T(1) and which is connected to the shift signal line 72-1 to which the shift signal p1(ϕ1) is supplied. Three n-ohmic electrodes 332, 333, and 334 are provided on the n-type semiconductor layer 87 exposed by removing the p-type semiconductor layer 88. The n-ohmic electrode 332 is an electrode (collector Cs electrode) connected to the collector Cs of the coupling transistor Q(1). The n-ohmic electrode 334 is an electrode (collector Cf electrode) connected to the collector Cf of the coupling transistor Q(1). The n-type semiconductor layer 87 between the p-ohmic electrode 322 and the n-ohmic electrodes 332 and 334 is removed (see FIG. 2B). The n-ohmic electrode 333 is an electrode (n-gate Gn electrode) connected to the n-gate Gn of the shift thyristor T(1).

The p-type semiconductor layer 86, n-type semiconductor layer 87, and p-type semiconductor layer 88 around the island 303 are removed by etching. In the island 303, two n-ohmic electrodes 335 and 336 are provided on the exposed n-type semiconductor layer 87. The n-type semiconductor layer 87 between the two n-ohmic electrodes 335 and 336 serves as the current limiting resistor RL.

The island 304 is formed similarly to the island 303. Three n-ohmic electrodes 337, 338, and 339 are provided on the n-type semiconductor layer 87 exposed by removing the p-type semiconductor layer 88. The n-type semiconductor layer 87 between the n-ohmic electrodes 337 and 338 serves as the coupling resistor Rc, while the n-type semiconductor layer 87 between the n-ohmic electrodes 338 and 339 serves as the power supply line resistor Rg.

The island 305 is formed similarly to the island 304. The start resistor Rs and the power supply line resistor Rg are disposed in the island 305. The islands 306 and 307 are formed similarly to the island 303. The current limiting resistors R1 and R2 are respectively disposed in the islands 306 and 307.

An n-ohmic electrode 340 is provided on the exposed n-type semiconductor layer 85 in the island 300. A back-side electrode 79 is provided on the back side of the n-type semiconductor substrate 80.

The connection relationship between the elements and lines in the light-emitting unit 10 will be discussed below. In FIG. 3A, lines (power supply line 71, shift signal lines 72-1 and 72-2, and voltage supply line 74) used for connecting elements in the light-emitting unit 10 are indicated by the thick straight lines.

The p-ohmic electrode 321 in the island 301, which is the anode A electrode of the light-emission control thyristor S(1), is connected to the voltage supply line 74 to which the light-emitting voltage VLD is supplied. The n-ohmic electrode 331 in the island 301, which is the n-gate Gn of the light-emission control thyristor S(1), is connected to the n-ohmic electrode 332 in the island 302, which is the collector Cs electrode of the coupling transistor Q(1). The n-ohmic electrode 332 is connected to the n-ohmic electrode 336 corresponding to the current limiting resistor RL in the island 303. The n-ohmic electrode 335 in the island 303 is connected to the voltage supply line 74.

The p-ohmic electrode 322 in the island 302, which is the anode A electrode of the shift thyristor T(1), is connected to the shift signal line 72-1. The shift signal line 72-1 is connected, via the current limiting resistor R1 in the island 306, to the φ1 terminal to which the shift signal p1 is supplied. The n-ohmic electrode 333 in the island 302, which is the n-gate Gn electrode of the shift thyristor T(1), is connected to an n-ohmic electrode, which is a node between the power supply line resistor Rg and the start resistor Rs, in the island 305. The n-ohmic electrode 334 in the island 302, which is the collector Cf electrode of the coupling transistor Q(1), is connected to the n-ohmic electrode 337 in the island 304, which is one of the n-ohmic electrodes corresponding to the coupling resistor Rc.

The n-ohmic electrode 338 in the island 304, which is the other one of the n-ohmic electrodes corresponding to the coupling resistor Rc, is connected to an n-ohmic electrode, which is the n-gate Gn electrode of the shift thyristor T(2). The n-ohmic electrode 339 in the island 304, which is the other one of the n-ohmic electrodes corresponding to the power supply line resistor Rg, is connected to the power supply line 71 to which the power supply potential VGK is supplied.

One of the n-ohmic electrodes corresponding to the start resistor Rs in the island 305 is connected to the shift signal line 72-2. The other one of the n-ohmic electrodes corresponding to the power supply line resistor Rg in the island 305 is connected to the power supply line 71. The shift signal line 72-2 is connected, via the current limiting resistor R2 in the island 307, to the φ2 terminal to which the shift signal p2 is supplied.

The shift signal line 72-1 is connected to the p-ohmic electrodes, which are the anode A electrodes of the odd-numbered shift thyristors T. The shift signal line 72-2 is connected to the p-ohmic electrodes, which are the anode A electrodes of the even-numbered shift thyristors T.

The other shift thyristors T, coupling transistors Q, light-emission control thyristors S, and VCSELs are formed similarly to the shift thyristor T(1), coupling transistor Q(1), light-emission control thyristor S(1), and VCSEL(1), respectively.

The n-ohmic electrode 340 disposed on the exposed n-type semiconductor layer 85 in the island 300 serves as the GND terminal to which the ground potential GND is supplied. The back-side electrode 79 on the back side of the n-type semiconductor substrate 80 is the Vdry terminal to which the driver voltage Vdry is supplied.

The shift thyristor T and the coupling transistor Q are disposed on the multilayer semiconductor layer (structure) equivalent to that on which the light-emission control thyristor S and the VCSEL are disposed. However, the n-ohmic electrode 340 is disposed on the n-type semiconductor layer 85 and is set to the ground potential GND. The driver voltage Vdry 0 V) is supplied to the back-side electrode 79 on the back side of the n-type semiconductor substrate 80. That is, the potential of the anode A of the p-type semiconductor layer 83 is bound to be lower than that of the cathode K of the n-type semiconductor layer 81, and the pn junction formed by the n-type semiconductor layer 81, active layer 82, and p-type semiconductor layer 83 is not forward-biased. Hence, the semiconductor layer 85 in the island 300 is insulated from the back-side electrode 79. In this manner, the light-emitting section 11 and the shifter 12 are electrically isolated from each other. A light-emitting current to be supplied to the VCSEL is thus turned ON/OFF at the ground potential side (ground side).

As discussed above, the light-emitting unit 10 is disposed on the semiconductor substrate 80 constituted by one semiconductor.

FIG. 4 is a timing chart illustrating the operation of the light source device 1 according to the first exemplary embodiment. The horizontal axis indicates the time, and the time elapses from time a to time r in alphabetical order. Between time c and time d, time $c_1$ through time $c_6$ are provided. Between time q and time r, time $q_1$ through time $q_6$ are provided. In FIG. 4, a temporal change in each of the shift signals p1 and p2 and the light-emitting signal pI is shown, and the shift thyristor T, the light-emission control thyristor S, and the VCSEL which are turned ON are each indicated by its alphabetical symbol and number. A set of the light-emission control thyristor S and the VCSEL is represented by S/VCSEL.

In this example, among the VCSEL(1) through the VCSEL(6) of the light-emitting unit 10 shown in FIG. 1, the VCSEL(1) and VCSEL(6) are caused to emit light. After the light-emitting unit 10 has caused the VCSEL(1) to emit light from the initial state, it returns to the initial state and then causes the VCSEL(6) to emit light. In this manner, the light-emitting unit 10 causes the VCSEL(1) and the VCSEL(6) to emit light. With this configuration, a desirable VCSEL can be selected and be caused to emit light. In other words, VCSELs can be randomly caused to emit light.

As discussed above with reference to FIG. 2A, the VCSEL(1) emits light as a result of the shift thyristor T(1) being turned ON, while the VCSEL(6) emits light as a result of the shift thyristor T(6) being turned ON. The VCSEL(1) is caused to emit light intermittently at time b, time $c_1$, time $c_2$, time $c_3$, time $c_4$, time $c_5$, and time $c_6$. The VCSEL(6) is caused to emit light intermittently at time p, time $q_1$, time $q_2$, time $q_3$, time $q_4$, time $q_5$, and time $q_6$. An individual intermittent light-emission period will be called a light-emitting pulse. The interval between light-emitting pulses (for example, the period from time c at which a light-emitting pulse is changed to OFF to time $c_1$ at which the next light-emitting pulse is changed to ON) is the same for all the light-emitting pulses. The pulse width of the light-emitting pulse (for example, the period from time b at which a light-emitting pulse is changed to ON to time c at which the light-emitting pulse is changed to OFF) is the same for all the light-emitting pulses. If the VCSEL is caused to emit light intermittently in this manner, the light-emission control thyristor S is more likely to be maintained in a state in which the VCSEL can emit light. Once the shift thyristor T causes the light-emission control thyristor S to be in such a state, the VCSEL is more likely to reemit light regardless of whether the shift thyristor T is ON. The pulse width of the light-emitting pulse may also be called the light-emitting pulse width, and the interval between light-emitting pulses may also be called the light-emitting pulse interval. The pulse width may be made different among the light-emitting pulses and the pulse interval may be made different among the light-emitting pulses as long as the VCSEL is caused to emit light intermittently. However, if the pulse width and the pulse interval are the same for all the light-emitting pulses, light emission can be controlled easily. If the light-emitting pulse interval is set to be longer than a period for which the VCSEL is ready to reemit light, the VCSEL becomes unable to reemit light. Hence, the light-emitting pulse interval is set to a length which can make a light-emitting pulse turned ON during the period for which the VCSEL is ready to reemit light.

The timing chart of FIG. 4 will be explained below in detail by referring to FIG. 1.

Before time a, the light-emitting unit 10 is in the initial state. The initial state is a state in which the power supply line 71 is at the power supply potential VGK (5 V), the ground line 73 is at the ground potential GND (0 V), the shift signals p1(φ1) and p2(φ2) are at "L" (0 V), the driver Dry is OFF, and the driver voltage Vdry is not supplied to the driver voltage line 75. In the initial state, the shift thyristor T(1) is in a state in which it can shift to the ON state.

At time a, the shift signal p1 is changed from "L" (0 V) to "H" (5 V). Then, the shift thyristor T(1) is turned ON and shifts from the OFF state to the ON state. Then, the anode A and the n-gate Gn of the light-emission control thyristor S(1) is forward-biased and the VCSEL(1) enters a state in which it can emit light.

At time b, the light-emitting signal pI is changed from "L" (0 V) to "H" (5 V). Then, the driver Dry is changed from OFF to ON and the driver voltage Vdry is changed to the ground potential GND (0 V). Then, the light-emission control thyristor S(1) is turned ON and the light-emitting voltage VLD (5 V) is applied to between the anode A of the light-emission control thyristor S(1) and the cathode K of the VCSEL(1). Then, a current flows through the light-emission control thyristor S(1) and the VCSEL(1) connected in series with each other, thereby causing the VCSEL(1) to emit light.

At time c, the shift signal p1 is changed from "H" (5 V) to "L" (0 V). Then, the shift thyristor T(1) is turned OFF and shifts from the ON state to the OFF state.

At time c, the light-emitting signal pI is changed from "H" (5 V) to "L" (0 V). Then, a current stops flowing through the anode A of the light-emission control thyristor S(1) and the cathode K of the VCSEL(1), thereby causing the VCSEL(1) to stop emitting light.

Thereafter, during the period from time c to time d, the light-emitting signal pI is switched from "L" (0 V) to "H" (5 V) and from "H" (5 V) to "L" (0 V) six times, thereby causing the VCSEL(1) to emit light six times.

During the period from time c to time d, the shift signal p1(φ1) is at "L" (0 V), the shift thyristor T(1) is OFF, and no current flows through the shift thyristor T(1) and the coupling transistor Q(1). The states of the other shift thyristors T are similar to that of the shift thyristor T(1). Power is thus less likely to be consumed in the shifter 12 (see FIG. 1). That is, when it is not necessary to maintain an ON signal from the coupling transistor Q(1), the ON signal is not maintained.

At time d, the initial state is resumed. At this time, the shift thyristor T(1) is in a state in which it can shift to the ON state.

At time e, the shift signal p1 is changed from "L" (0 V) to "H" (5 V). Then, as in time a, the shift thyristor T(1) is turned ON and shifts from the OFF state to the ON state.

At time f, the shift signal p2 is changed from "L" (0 V) to "H" (5 V). Then, the shift thyristor T(2) is turned ON and shifts from the OFF state to the ON state.

At time g, the shift signal p1 is changed from "H" (5 V) to "L" (0 V). Then, the shift thyristor T(1) is turned OFF.

Then, at time h, the shift thyristor T(3) is turned ON, and, at time i, the shift thyristor T(2) is turned OFF. Then, at time j, the shift thyristor T(4) is turned ON, and, at time k, the shift thyristor T(3) is turned OFF. Then, at time 1, the shift thyristor T(5) is turned ON, and, at time m, the shift thyristor T(4) is turned OFF. Then, at time n, the shift thyristor T(6) is turned ON, and, at time o, the shift thyristor T(5) is turned OFF. At this time, the anode A and the n-gate Gn of the light-emission control thyristor S(6) is forward-biased, and the VCSEL(6) enters a state in which it can emit light.

At time p, the light-emitting signal pI is changed from "L" (0 V) to "H" (5 V). Then, the driver Dry is changed from OFF to ON and the driver voltage Vdry is changed to the ground potential GND (0 V). Then, the VCSEL(6) emits light, as the VCSEL(1) emits light in time b.

At time q, the shift signal p2 is changed from "H" (5 V) to "L" (0 V). Then, the shift thyristor T(6) is turned OFF.

At time q, the light-emitting signal pI is changed from "H" (5 V) to "L" (0 V). Then, the VCSEL(6) stops emitting light.

Thereafter, during the period from time q to time r, the light-emitting signal pI is switched from "L" (0 V) to "H" (5 V) and from "H" (5 V) to "L" (0 V) six times, thereby causing the VCSEL(6) to emit light six times.

During the period from time q to time r, the shift signal p2(φ2) is at "L" (0 V), the shift thyristor T(6) is OFF, and no current flows through the shift thyristor T(6) and the coupling transistor Q(6). The states of the other shift thyristors T and coupling transistors Q are similar to that of the shift thyristor T(6) and that of the coupling transistor Q(6). Power is thus less likely to be consumed in the shifter 12 (see FIG. 1). That is, when it is not necessary to maintain an ON signal from the coupling transistor Q(6), the ON signal is not maintained.

As described above, between two adjacent shift thyristors T, the shifter 12 turns ON the shift thyristor T on the upstream side in the shifting direction and then turns ON the shift thyristor T on the downstream side in the shifting direction. Then, the shifter 12 turns OFF the shift thyristor T on the upstream side. In this manner, based on the shift signals (shift signals p1 and p2) out of phase by 180 degrees, the ON state is sequentially shifted among the shift thyristors T in the shifter 12, that is, the above-described shift operation is performed. During the shift operation based on the shift signals p1 and p2, there is a period (from time f to time g, for example) for which two adjacent shift thyristors T are ON at the same time.

Figure 5:
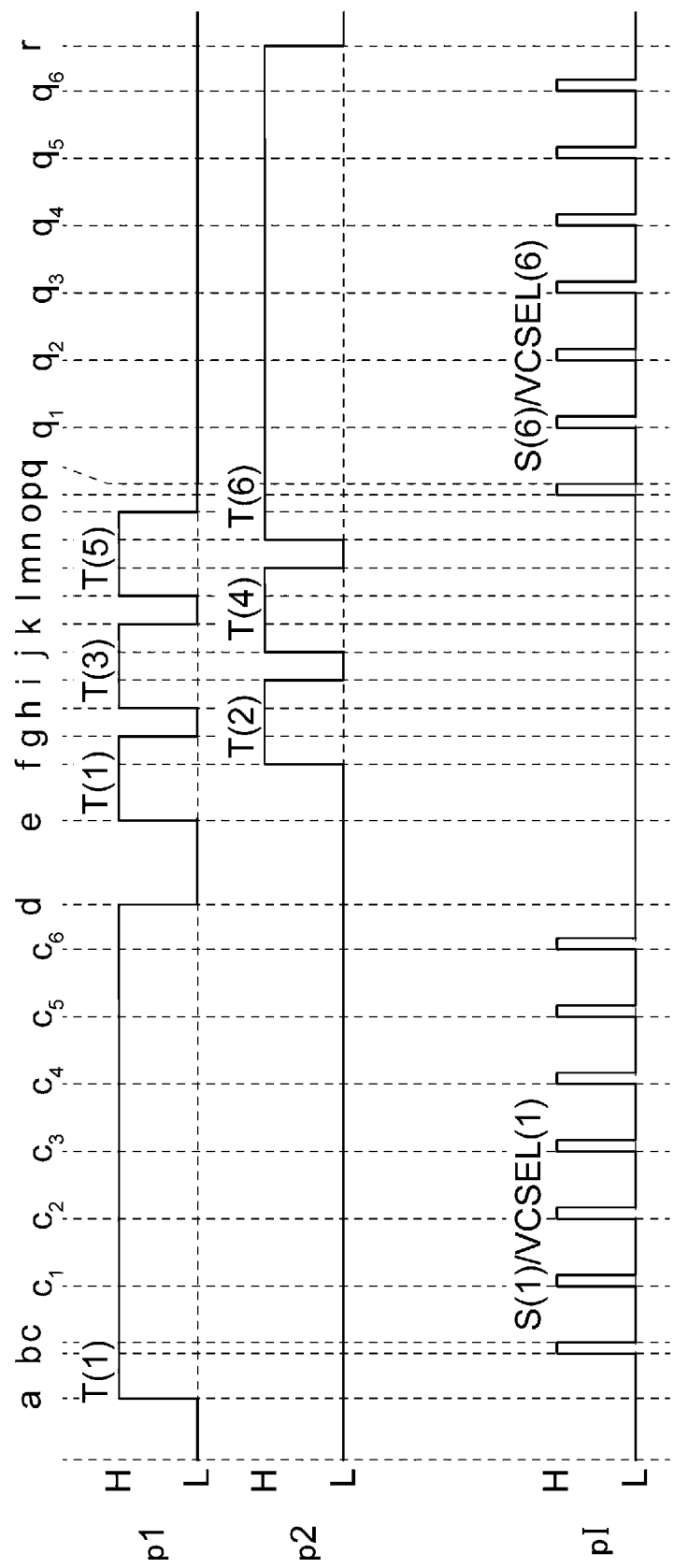
FIG. 5 is a timing chart illustrating the operation of a light source device to which the first exemplary embodiment is not applied.

FIG. 5 is a timing chart illustrating the operation of the light source device 1 to which the first exemplary embodiment is not applied, that is, the operation of the related art. The same light-emitting unit 10 of the first exemplary embodiment is used. The horizontal axis indicates the time, as in FIG. 4.

In the related art in FIG. 5, the ON state of the shift thyristor T(1) is maintained during the period from time c to time d for which the light emission of the VCSEL(1) is intermittently repeated. Likewise, the ON state of the shift thyristor T(6) is maintained during the period from time q to time r for which the light emission of the VCSEL(6) is intermittently repeated. During these periods, a current for maintaining the ON state continues to flow through the shift thyristor T(1) or T(6). Hence, more power is consumed by the operation of the related art than that by the operation of the light source device 1 illustrated in FIG. 4.

As discussed with reference to FIG. 4, the VCSEL is caused to intermittently emit light during a period for which the shift thyristor T is in the OFF state (period from time c to time d in FIG. 4, for example). This will be explained below.

Figure 6A:
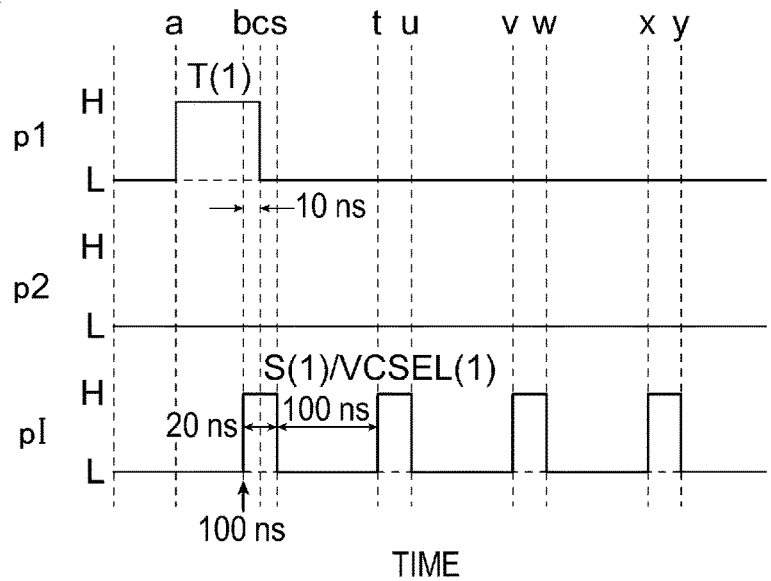
FIG. 6A is a timing chart for explaining an intermittent light-emitting operation of a VCSEL.
Figure 6B:
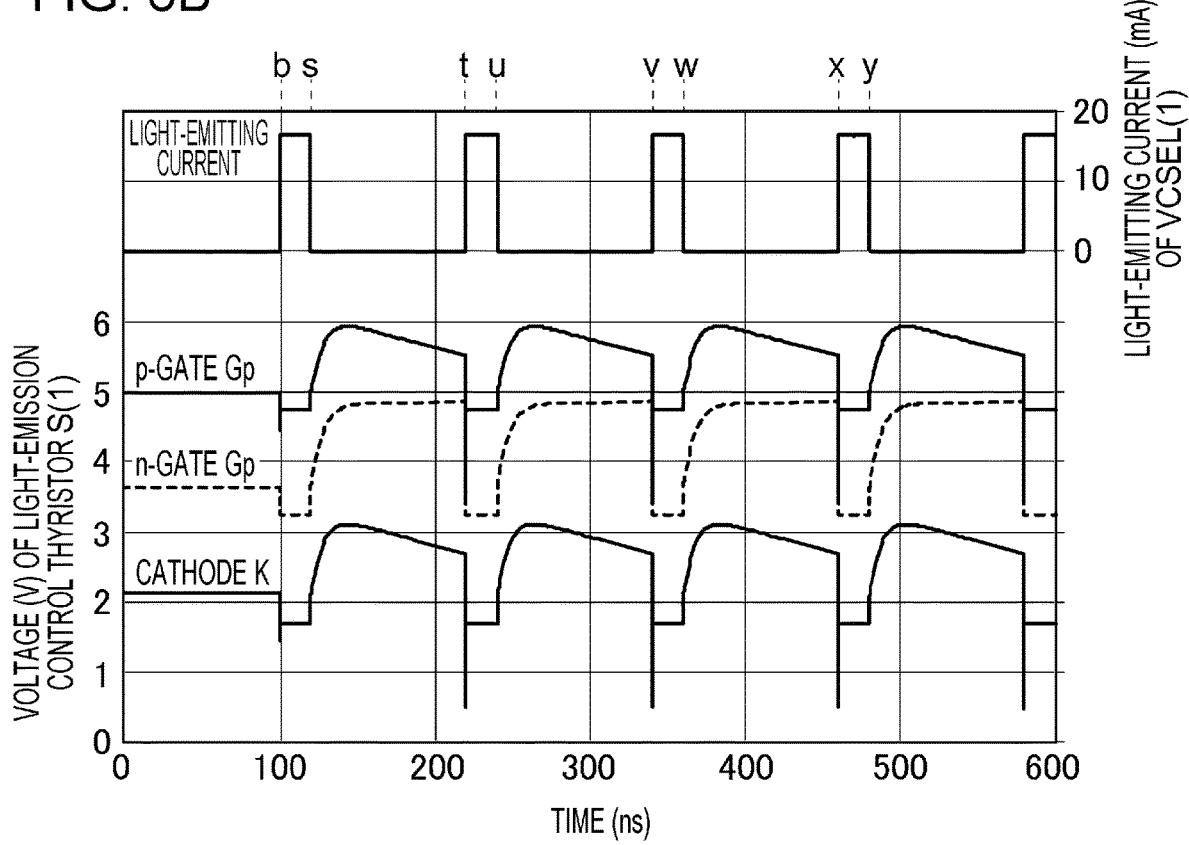
FIG. 6B illustrates the voltage of a light-emission control thyristor and the light-emitting current of a VCSEL connected in series with each other when the light-emitting operation is performed in accordance with the timing chart of FIG. 6A.

FIG. 6A is a timing chart, which is part of the timing chart starting from time a in FIG. 4. FIG. 6B illustrates the voltage of the light-emission control thyristor S(1) and the light-emitting current of the VCSEL(1). The light-emission control thyristor S(1) and the VCSEL(1) are connected in series with each other. In FIG. 6A, time s to time y are added to the period from time c to time d (see FIG. 4) in alphabetical order. In FIG. 6B, the horizontal axis indicates the time (ns). The left vertical axis indicates the voltages (V) at the p-gate Gp, n-gate Gn, and cathode K of the light-emission control thyristor S(1). The right vertical axis indicates the light-emitting current (mA) of the VCSEL(1).

The timing chart of FIG. 6A will be explained below.

At time a, the shift signal p1 is changed from "L" (0 V) to "H" (5 V) and the shift thyristor T(1) is turned ON. At time b, the light-emitting signal pI is changed from "L" (0 V) to "H" (5 V) and the VCSEL(1) starts to emit light. This time, that is, time b, corresponds to 100 ns on the time axis in FIG. 6B. After the lapse of 10 ns from time b, at time c, the shift signal p1 is changed from "H" (5 V) to "L" (0 V) and the shift thyristor T(1) is turned OFF. After the lapse of 10 ns from time c, at time s, the light-emitting signal pI is changed from "H" (5 V) to "L" (0 V) and the VCSEL(1) stops emitting light. The VCSEL(1) is OFF for 100 ns from time s. Then, at time t, the light-emitting signal pI is changed from "L" (0 V) to "H" (5 V) again and the VCSEL(1) starts to reemit light. Thereafter, the switching of the light-emitting signal pI between "H" (5 V) and "L" (0 V) as in the period from time b to time t is repeated. That is, the VCSEL(1) emits light for 20 ns from time b, which corresponds to 100 ns, and then stops emitting light for 100 ns, and then reemits light for 20 ns. In this manner, the VCSEL (1) repeatedly reemits light at the equal time intervals. The light-emission period from time b to time s is a light-emitting pulse. The length from time b to time s is the width of the light-emitting pulse. The interval between light-emitting pluses is the pulse interval of light-emitting pulses, which may also be called the light-emission interval.

FIG. 6B illustrates simulation results obtained under the conditions that the voltages of elements shown in FIG. 1 are as follows: the light-emitting current limiting resistor RI is 100Ω, the power supply potential VGK supplied from the power source VS1 and the light-emitting voltage VLD supplied from the power source VS2 are 5 V, the ON-resistance Ron of the driver Dry is 1Ω, and the OFF-resistance Roff of the driver Dry is 1 MΩ. Although the p-gate Gp is not used, the voltage thereof is shown in FIG. 6B.

FIG. 7A is an equivalent circuit diagram of the light-emission control thyristor S(1) and the VCSEL(1). FIG. 7B illustrates semiconductor layers (see FIG. 3B) and parasitic capacitors generated at pn junctions. In FIG. 7B, the n-type semiconductor layer 81 forming the cathode K of the VCSEL(1) and the p-type semiconductor layer 83 forming the anode A of the VCSEL(1) are shown. In FIG. 7B, the n-type semiconductor layer 85 forming the cathode K of the light-emission control thyristor S(1), the p-type semiconductor layer 86 forming the p-gate Gp of the light-emission control thyristor S(1), the n-type semiconductor layer 87 forming the n-gate Gn of the light-emission control thyristor S(1), and the p-type semiconductor layer 88 forming the anode A of the light-emission control thyristor S(1) are shown. The active layer 82 and the tunnel junction layer 84 are not shown.

A parasitic capacitor Cv is generated at the pn junction between the cathode K (n-type semiconductor layer 81) and the anode A (p-type semiconductor layer 83) of the VCSEL (1). A parasitic capacitor Cgk is generated at the pn junction between the cathode K (n-type semiconductor layer 85) and the p-gate Gp (p-type semiconductor layer 86) of the light-emission control thyristor S(1). A parasitic capacitor Cgg is generated at the pn junction between the p-gate Gp (p-type semiconductor layer 86) and the n-gate Gn (n-type semiconductor layer 87) of the light-emission control thyristor S(1). A parasitic capacitor Cag is generated at the pn junction between the n-gate Gn (n-type semiconductor layer 87) and the anode A (p-type semiconductor layer 88) of the light-emission control thyristor S(1). The tunnel junction layer 84 is interposed between the anode A (p-type semiconductor layer 83) of the VCSEL(1) and the cathode K (n-type semiconductor layer 85) of the light-emission control thyristor S(1). The anode A of the VCSEL(1) and the cathode K of the light-emission control thyristor S(1) are at the same potential and no parasitic capacitor is generated therebetween.

The timing chart of FIG. 6A will be explained by referring to FIGS. 7A and 7B.

At time a, when the shift thyristor T(1) is turned ON, the collector Cs of the coupling transistor Q(1) starts to draw a current from the n-gate Gn of the light-emission control thyristor S(1). At this time, since the light-emitting voltage VLD (voltage supply line 74) is at 5 V, the anode A of the light-emission control thyristor S(1) is also at 5 V. The anode A and the n-gate Gn of the light-emitting control thyristor S(1) is forward-biased, and the voltage at the n-gate Gn results in 3.5 V, which is obtained by subtracting the forward voltage Vd (1.5 V) from the voltage at the anode A. The voltage at the p-gate Gp results in 4.7 V, which is obtained by subtracting the saturation voltage Vc (0.3 V) from the voltage at the anode A. The voltage at the cathode K results in 1.7 V, which is lower than the voltage at the p-gate Gp by 2×Vd, by reflecting the forward voltage Vd (1.5 V). This is the state immediately before time b in FIG. 6A, which corresponds to 100 ns on the time axis in FIG. 6B.

At time b, the light-emitting signal pI is changed from "L" (0 V) to "H" (5 V) and the driver Drv is turned ON. Then, the driver voltage line 75 connected to the cathode K of the VCSEL(1) is changed to the ground potential GND via the driver Drv and the light-emitting current limiting resistor RI. This turns ON the light-emission control thyristor S(1) and causes the VCSEL(1) to emit light. In the simulation results shown in FIG. 6B, as a result of a light-emitting current flowing through the light-emission control thyristor S(1), the n-gate Gn is at a voltage of about 3.2 V, the p-gate Gp is at a voltage of about 4.7 V, and the cathode K is at a voltage of about 1.7 V.

At time c, the shift signal p1 is changed from "H" (5 V) to "L" (0 V). The voltage at the n-gate Gn still remains the same since the VCSEL(1) keeps emitting light.

At time s, the light-emitting signal pI is changed from "H" (5 V) to "L" (0 V) and the driver Drv is turned OFF. The voltage of the driver Drv is switched from the ON-resistance Ron at 1 Ω to the OFF-resistance Roff at 1 MΩ. With a high OFF-resistance Roff, the current between the anode A of the light-emission control thyristor S(1) and the cathode K of the VCSEL(1) becomes lower than the holding current. The light-emission control thyristor S(1) is thus turned OFF and is shifted from the ON state to the OFF state, and the VCSEL(1) stops emitting light. At this time, the voltage at the n-gate Gn rises toward the light-emitting voltage VLD (5 V) since the n-gate Gn is connected to the voltage supply line 74 at the light-emitting voltage VLD (5 V) via the current limiting resistor RL. That is, the parasitic capacitor Cag (capacitance value Cag) is discharged at a time constant of RL×Cag via the current limiting resistor RL (resistance value RL). Meanwhile, electric charge stored in the parasitic capacitors Cgg, Cgk, and Cv is unable to move, and the voltage at the p-gate Gp and that at the cathode K are thus raised by a value corresponding to a rise in the voltage at the n-gate Gn. In FIG. 6B, the voltage at the n-gate Gn is about 5 V, the voltage at the p-gate Gp is about 6 V, and the voltage at the cathode K is about 3 V.

At time t, the light-emitting signal pI is changed from "L" (0 V) to "H" (5 V) and the driver Drv is turned ON again. Then, the driver voltage line 75 connected to the cathode K of the VCSEL(1) suddenly starts to shift toward the ground potential GND (0 V). A displacement current thus flows through the parasitic capacitors Cag, Cgg, and Cgk, and, by using this displacement current as a threshold current, the light-emission control thyristor S(1) is turned ON and the VCSEL(1) emits light.

At time u, the light-emitting signal pI is changed from "H" (5 V) to "L" (0 V) and the driver Drv is turned OFF. Then, the light-emission control thyristor S(1) is turned OFF and the VCSEL(1) stops emitting light, as at time s. As a result of repeating the operation performed from time s to time t, the VCSEL(1) intermittently emits light multiple times.

"The light-emission control thyristor S is in the OFF state or is turned OFF" does not mean that a signal for turning OFF the light-emission control thyristor S is supplied, but that a signal for maintaining the ON state of the light-emission control thyristor S is not supplied. As stated above, when the collector Cs of the coupling transistor Q is turned OFF, a signal for shifting the light-emission control thyristor S to be in a state in which it can shift to the ON state is no longer supplied to the n-gate Gn of the light-emission control thyristor S. Nonetheless, this state of the light-emission control thyristor S is maintained for a while thanks to the stored electric charge.

In FIG. 6A, the shift signal p1 is changed from "H" (5 V) to "L" (0 V) and the shift thyristor T(1) is turned OFF at time c, and then, the light-emitting signal pI is changed from "H" (5 V) to "L" (0 V) and the VCSEL(1) stops emitting light at time s. This time delay can set the cathode K of the light-emission control thyristor S(1) at a high voltage and cause the VCSEL(1) to reliably reemit light. In FIG. 6A, before the shift thyristor T(1) is turned OFF, the VCSEL(1) emits light one time. The VCSEL(1) may emit light multiple times.

Figure 8:
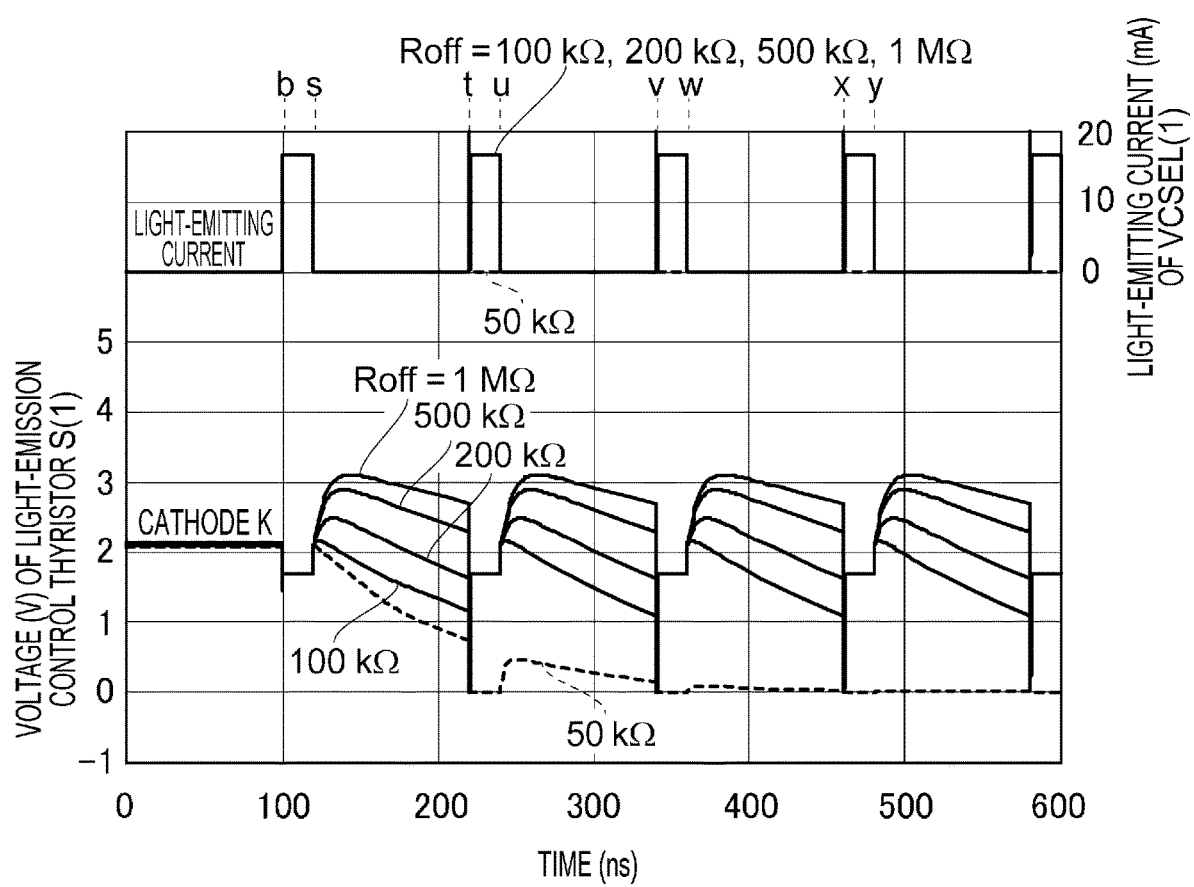
FIG. 8 is a graph illustrating the voltage at the cathode of a light-emission control thyristor and the light-emitting current of a VCSEL in a case in which the OFF-resistance of a driver is varied.

FIG. 8 is a graph illustrating the voltage at the cathode K of the light-emission control thyristor S(1) and the light-emitting current of the VCSEL(1) in a case in which the OFF-resistance of the driver Drv is varied. FIG. 8 shows simulation results obtained under the conditions that the OFF-resistance is set to 50 kΩ, 100 kΩ, 200 kΩ, 500 kΩ, and 1 MΩ. The timing chart in FIG. 6A is used for this simulation.

As the OFF-resistance Roff is lower, a voltage drop at the cathode K of the light-emission control thyristor S(1) after the VCSEL(1) stops emitting light is greater. In a case in which the OFF-resistance Roff is set to any of 100 kΩ, 200 kΩ, 500 kΩ, and 1 MΩ, the VCSEL(1) reemits light at time t after the light-emission control thyristor S(1) is turned OFF, that is, the shifter 12 is turned OFF, at the timing in FIG. 6A. That is, even after the shifter 12 is turned OFF, the VCSEL(1) can intermittently emit light multiple times (VCSEL(1) becomes able to reemit light).

In contrast, in a case in which the OFF-resistance Roff is set to 50 kΩ, the VCSEL(1) does not reemit light at time t after the light-emission control thyristor S(1) is turned OFF, that is, the shifter 12 is turned OFF, at the timing in FIG. 6A. The reason for this is as follows. Even though the driver Drv is turned ON, a voltage change of the driver voltage line 75 connected to the cathode K of the VCSEL(1) is small and a sufficiently high displacement current does not flow, thereby failing to turn ON the light-emission control thyristor S(1).

The simulations show that the voltage at the cathode K which makes the light-emission control thyristor S(1) no longer turned ON is lower than 0.9 V. At this voltage of the cathode K, the light-emission control thyristor S(1) is no longer turned ON and the VCSEL(1) no longer reemits light (VCSEL(1) becomes unable to reemit light). The voltage at the cathode K is determined by the parasitic capacitor at each pn junction (parasitic capacitors Cgg, Cgk, and Cv in FIG. 7B), the threshold current of the light-emission control thyristor S(1), and the velocity dV/dt of a voltage change of the driver voltage line 75, for example. The light-emission control thyristor S is an example of a capacitor, and a set of the light-emission control thyristor S and the VCSEL connected in series with each other is an example of a light-emitting element having a capacitor.

The OFF-resistance Roff of the driver Drv may desirably be higher to cause the VCSEL to intermittently emit light after the shifter 12 is turned OFF. As discussed above, after the VCSEL is turned ON, it becomes unable to reemit light if the voltage at the cathode K of the light-emission control thyristor S becomes lower than 0.9 V. As shown in FIG. 8, a voltage drop at the cathode K of the light-emission control thyristor S becomes smaller as the OFF-resistance Roff is higher. Nevertheless, if the OFF-resistance Roff is too high, after the VCSEL is turned ON and is then turned OFF, the period for which the VCSEL is still able to reemit light becomes longer. In the shift operation, after a VCSEL has become unable to reemit light, another VCSEL is caused to emit light. If the period for which a VCSEL is ready to reemit light is long, a period (OFF period) before another VCSEL can emit light becomes long.

Figure 9A:
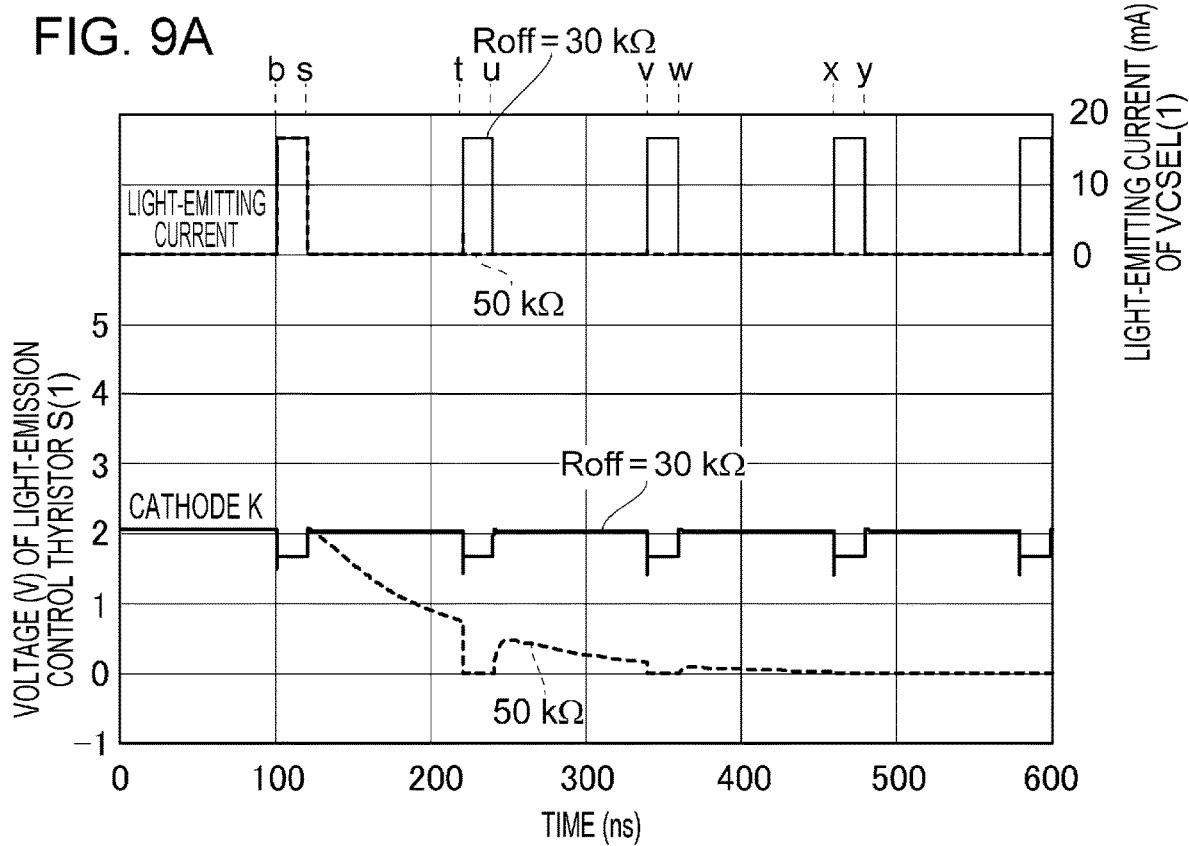
FIG. 9A is another graph illustrating the voltage at the cathode of the light-emission control thyristor and the light-emitting current of the VCSEL in a case in which the OFF-resistance of the driver is varied.
Figure 9B:
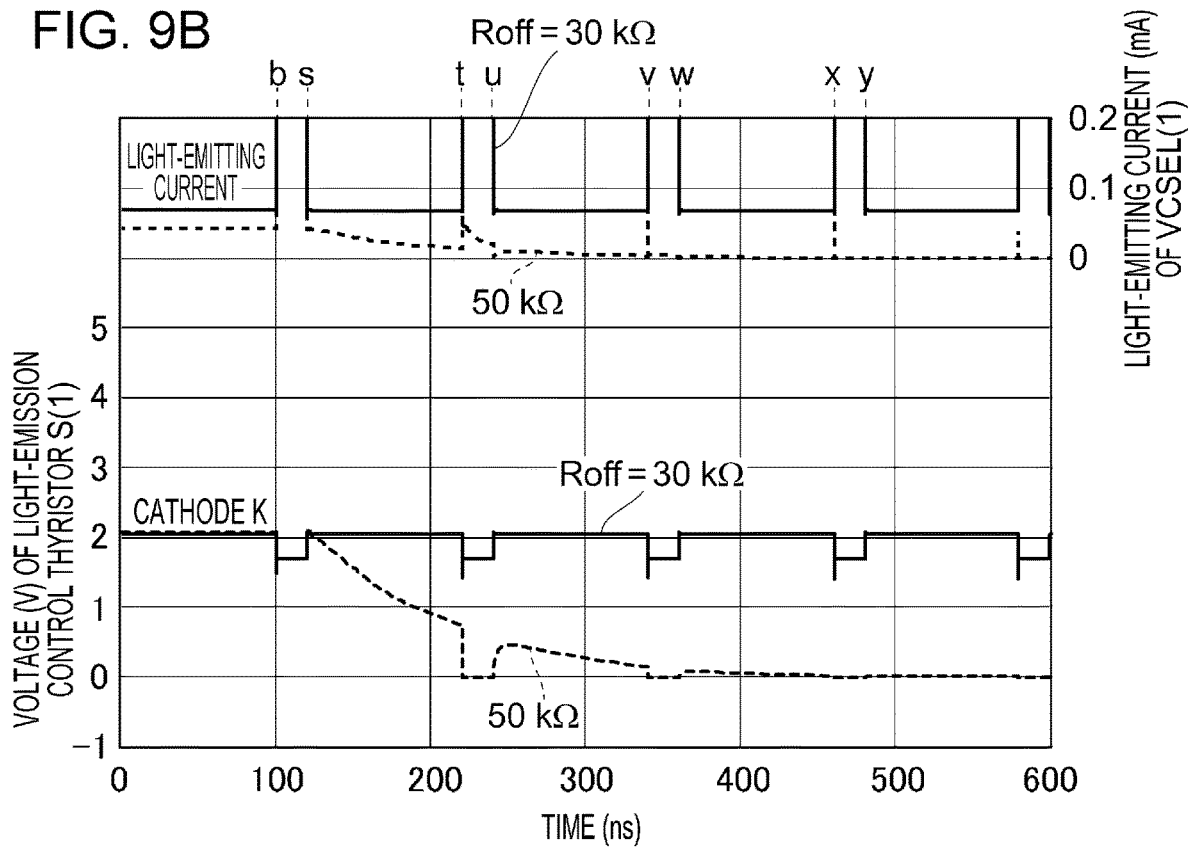
FIG. 9B is an enlarged graph illustrating the voltage at the cathode of the light-emission control thyristor and a specific portion of the range of the light-emitting current of the VCSEL shown in FIG. 9A.

FIG. 9A is another graph illustrating the voltage at the cathode K of the light-emission control thyristor S(1) and the light-emitting current of the VCSEL(1) in a case in which the OFF-resistance of the driver Dry is varied. In FIG. 9A, the right vertical axis indicates the entire range of the light-emitting current. In FIG. 9B, the right vertical axis indicates a specific portion of the range of the light-emitting current in FIG. 9A. In FIGS. 9A and 9B, the simulation results obtained when the OFF-resistance Roff is set to be 50 kΩ and 30 kΩ are shown. The timing chart in FIG. 6A is used for this simulation. The result obtained when the OFF-resistance Roff is 50 kΩ is the same as that shown in FIG. 8.

If the OFF-resistance Roff is low, when the driver Dry is turned OFF, the voltage at the cathode K of the light-emission control thyristor S approaches 0 V very quickly. If the OFF-resistance Roff is very low, however, a current higher than or equal to the holding current continues to flow through the light-emitting control thyristor S even after the driver Dry is turned OFF, and the light-emission control thyristor S is not turned OFF.

As shown in FIG. 9A, when the OFF-resistance Roff is 50 kΩ, the VCSEL does not reemit light at time t. On the other hand, however, when the OFF-resistance Roff is 30 kΩ, the VCSEL reemits light at time t. At time v and time x, the VCSEL also reemits light. The enlarged graph in FIG. 9B shows that, when the OFF-resistance Roff is 50 kΩ, the light-emitting current falls during the period for which the driver Dry is OFF and is reduced to almost 0 A at time u onwards. FIG. 9B also shows that, when the OFF-resistance Roff is 30 kΩ, a light-emitting current of 0.07 mA continues to flow during the period for which the driver Dry is OFF. That is, a current higher than or equal to the holding current continues to flow in the light-emission control thyristor S(1) so that the light-emission control thyristor S(1) can maintain the ON state.

It is thus necessary to set the OFF-resistance Roff of the driver Dry to a value which makes the following conditions satisfied: the state of a VCSEL is maintained to be ready to reemit light during the period for which the VCSEL is ready to reemit light; and the period before this VCSEL becomes unable to reemit light (OFF period for another VCSEL) is not too long. It is also necessary to set the OFF-resistance Roff to a value which makes the following condition satisfied: a current higher than or equal to the holding current does not flow through the light-emission control thyristor S during the period for which the driver Dry is OFF. In other words, the OFF-resistance Roff of the driver Dry is set in accordance with a preset period before the VCSEL becomes unable to reemit light (that is, the OFF period for another VCSEL).

As described above, the period for which the VCSEL is ready to reemit light and the period before the VCSEL becomes unable to reemit light (OFF period for another VCSEL) are determined by the OFF-resistance Roff of the driver Dry. There may be a case, however, in which it is desirable to set the period for which the VCSEL is ready to reemit light to be longer than the period determined by the OFF-resistance Roff.

Figure 10:
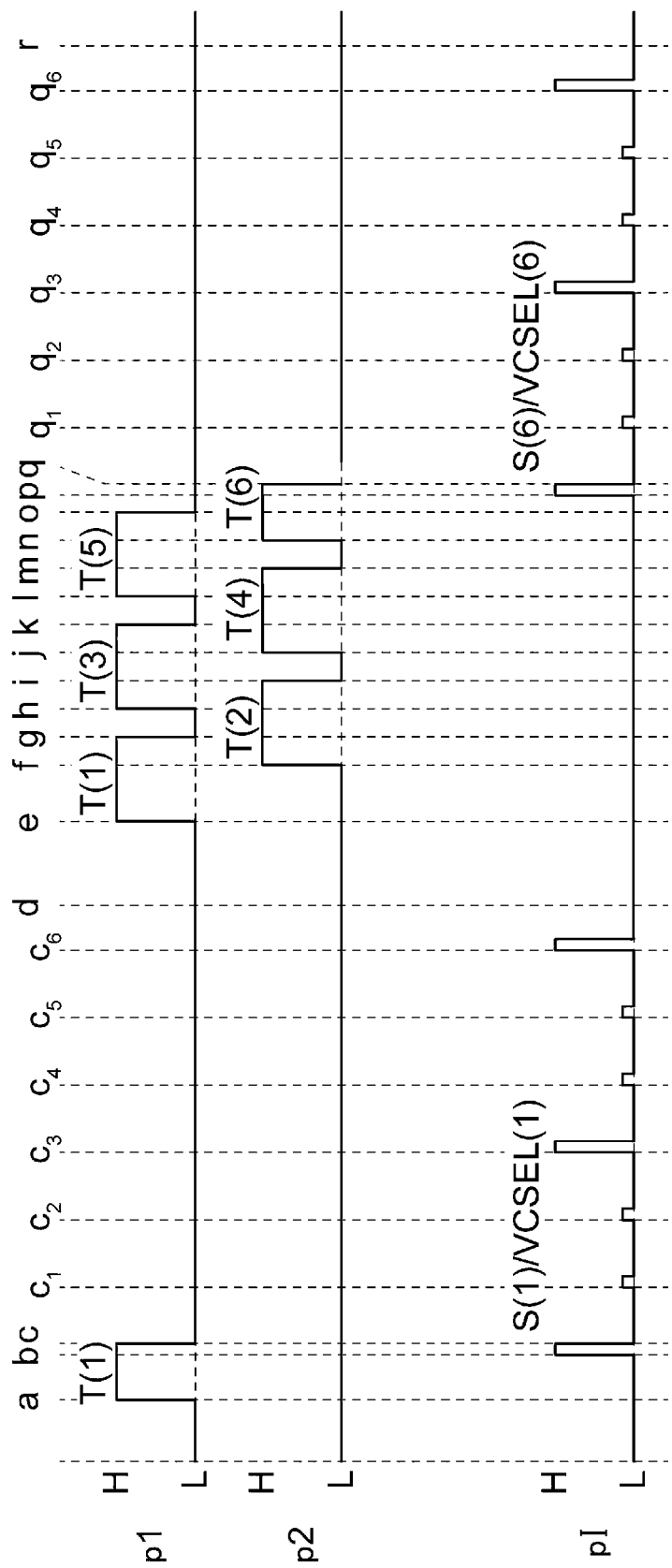
FIG. 10 is a timing chart for explaining an approach to setting a period for which a VCSEL is ready to reemit light to be longer.

FIG. 10 is a timing chart for explaining an approach to setting the period for which the VCSEL is ready to reemit light to be longer. The timing chart of FIG. 10 is similar to that of FIG. 4. In the timing chart in FIG. 4, the start times of the individual light-emitting pulses are provided at time b, time $c_1$, time $c_2$, time $c_3$, time $c_4$, time $c_5$, time $c_6$, time p, time $q_1$, time $q_2$, time $q_3$, time $q_4$, time $q_5$, and time $q_6$. In the timing chart in FIG. 10, however, the light-emitting signal pI is reduced at time $c_1$, time $c_2$, time $c_4$, time $c_5$, time $q_1$, time $q_2$, time $q_4$, and time $q_5$ so that a current flowing through the VCSEL becomes smaller than that in FIG. 4. With this setting, while the amount of light of the VCSEL is reduced, the voltage at the cathode K of the light-emission control thyristor S is raised, as in when the VCSEL is caused to emit light, and the VCSEL becomes ready to reemit light. Light-emitting pulses set in the above-described manner are called holding pulses. More specifically, while pulses starting at time b, time $c_3$, time $c_6$, time p, time $q_3$, and time $q_6$ are light-emitting pulses, pulses starting at time $c_1$, time $c_2$, time $c_4$, time $c_5$, time $q_1$, time $q_2$, time $q_4$, and time $q_5$ are holding pulses. In the timing chart in FIG. 4 without using holding pulses, the period for which the VCSEL(1) is ready to emit light is from time c to time $c_1$. In contrast, in the timing chart in FIG. 10 using holding pulses, the period for which the VCSEL(1) is ready to emit light is from time c to time $c_3$, which is three times longer than that in FIG. 4. Although two holding pulses are provided between light-emitting pulses in FIG. 10, three or more holding pulses may be provided. Providing holding pulses can extend the period for which the VCSEL is ready to reemit light to a desirable period.

In FIG. 10, the interval between holding pulses and the interval between a holding pulse and a light-emitting pulse (these intervals will be called the pulse interval unless it is necessary to distinguish them from each other) for the VCSEL(1) and VCSEL(6) are set to be equal to each other. The widths of the light-emitting pulses and those of the holding pulses are also equal to each other. However, the pulse interval may be set in a desirable manner as long as the period for which the VCSEL is ready to reemit light continues. Likewise, the width of the holding pulse may be set in a desirable manner as long as the period for which the VCSEL is ready to reemit light continues. The amount of light of the VCSEL emitted by the holding pulse is set to be smaller than that of the VCSEL emitted by the light-emitting pulse, and the velocity dV/dt of a voltage change is adjusted so that the light-emission control thyristor S can enter a state in which the VCSEL can emit light. If these conditions are satisfied, the VCSEL may emit almost no light by the holding pulse. If it is not desired that the VCSEL emit light by the holding pulse, the current value may be adjusted to be lower than or equal to the threshold current of the VCSEL. The holding pulse may be inserted before the first light-emitting pulse. In this case, it may be desirable that the timing at which the shift thyristor T is turned OFF be after the first light-emitting pulse.

Second Exemplary Embodiment

In the first exemplary embodiment, the driver Dry has only one OFF-resistance Roff. In a second exemplary embodiment, The OFF-resistance Roff of the driver Dry can be switched between multiple values.

Figure 11:
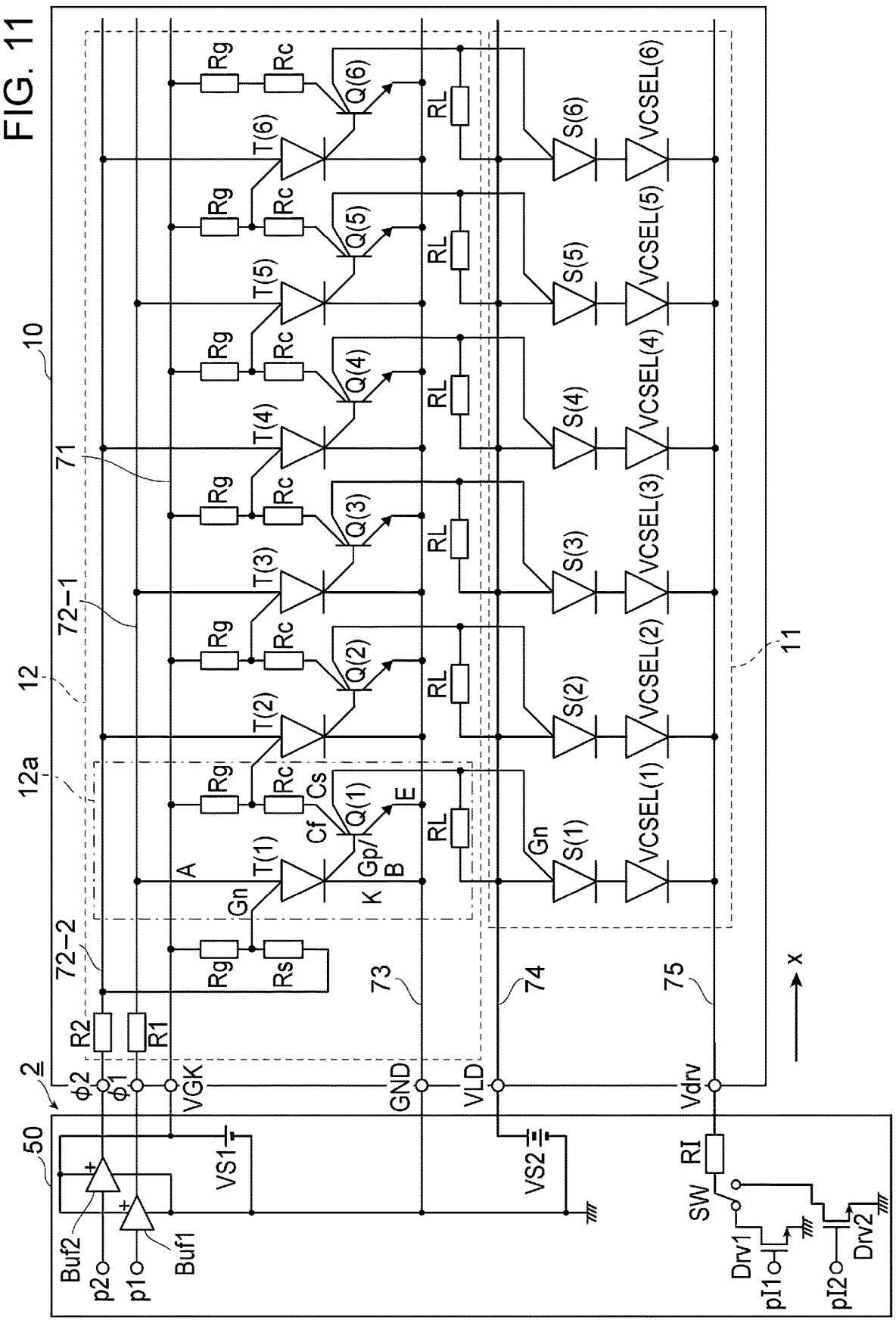
FIG. 11 illustrates a light source device according to a second exemplary embodiment.

FIG. 11 illustrates a light source device 2 according to the second exemplary embodiment. The controller 50 of the light source device 2 includes two drivers Drv1 and Drv2 instead of the driver Drv used in the first exemplary embodiment. The driver Drv1 has an ON-resistance Ron1 and an OFF-resistance Roff1. The driver Drv2 has an ON-resistance Ron2 and an OFF-resistance Roff2. The ON-resistance Ron1 and the ON-resistance Ron2 may be the same or may be different from each other. The OFF-resistance Roff1 and the OFF-resistance Roff2 are different (Roff1>Roff2, for example). The drivers Drv1 and Drv2 are connected to the light-emitting current limiting resistor RI via a switch SW. As a result of changing the state of the switch SW, the drivers Drv1 and Drv2 can be switched therebetween. The switch SW may be an NMOS transistor having a larger resistance value than one of the OFF-resistance Roff1 and the OFF-resistance Roff2.

The driver Drv2 having a smaller OFF-resistance Roff2 can drop the voltage at the cathode K of the light-emission control thyristor S faster than the driver Drv1 having a larger OFF-resistance Roff1. This shortens the period for which the VCSEL intermittently emits light and also shortens the period before the VCSEL becomes unable to reemit light (OFF period for another VCSEL). The period for which the VCSEL intermittently emits light may be set by switching between the drivers Drv1 and Drv2. The above-described OFF period may also be set by switching between the drivers Drv1 and Drv2.

The value of the OFF-resistance Roff may be changed in the following manner. Plural resistors having different resistance values which are smaller than the OFF-resistance of an NMOS transistor may be connected in parallel between the source and the drain of the NMOS transistor via a switch. By switching the state of the switch, the OFF-resistance Roff of the driver Drv can be changed. This makes it possible to select the period for which the VCSEL is ready to reemit light.

Third Exemplary Embodiment

In the light source device 1 of the first exemplary embodiment and the light source device 2 of the second exemplary embodiment, the period before the VCSEL becomes unable to reemit light (OFF period for another VCSEL) is determined by the OFF-resistance Roff of the driver Drv. In a light source device 3 of a third exemplary embodiment, to set the OFF period to be shorter, a reemission stop pulse is provided to cause the VCSEL to stop reemitting light. After the VCSEL intermittently emits light plural times, the light-emission control thyristor S may be likely to remain its ON state, or the light-emission control thyristor S may be turned ON due to malfunctioning, which cause the VCSEL to erroneously emit light. In this situation, the reemission stop pulse can stop the VCSEL from emitting light. Without the reemission stop pulse, to stop a VCSEL from reemitting light, it is necessary to wait until electric charge of the light-emission control thyristor S connected to this VCSEL is discharged. This delays a timing at which another VCSEL starts emitting light and may fail to perform high-speed driving, which is required where VCSELs are sequentially switched to be turned ON. The provision of the reemission stop pulse shortens the period before the VCSEL becomes unable to reemit light (OFF period for another VCSEL) and facilitates high-speed driving.

Figure 12:
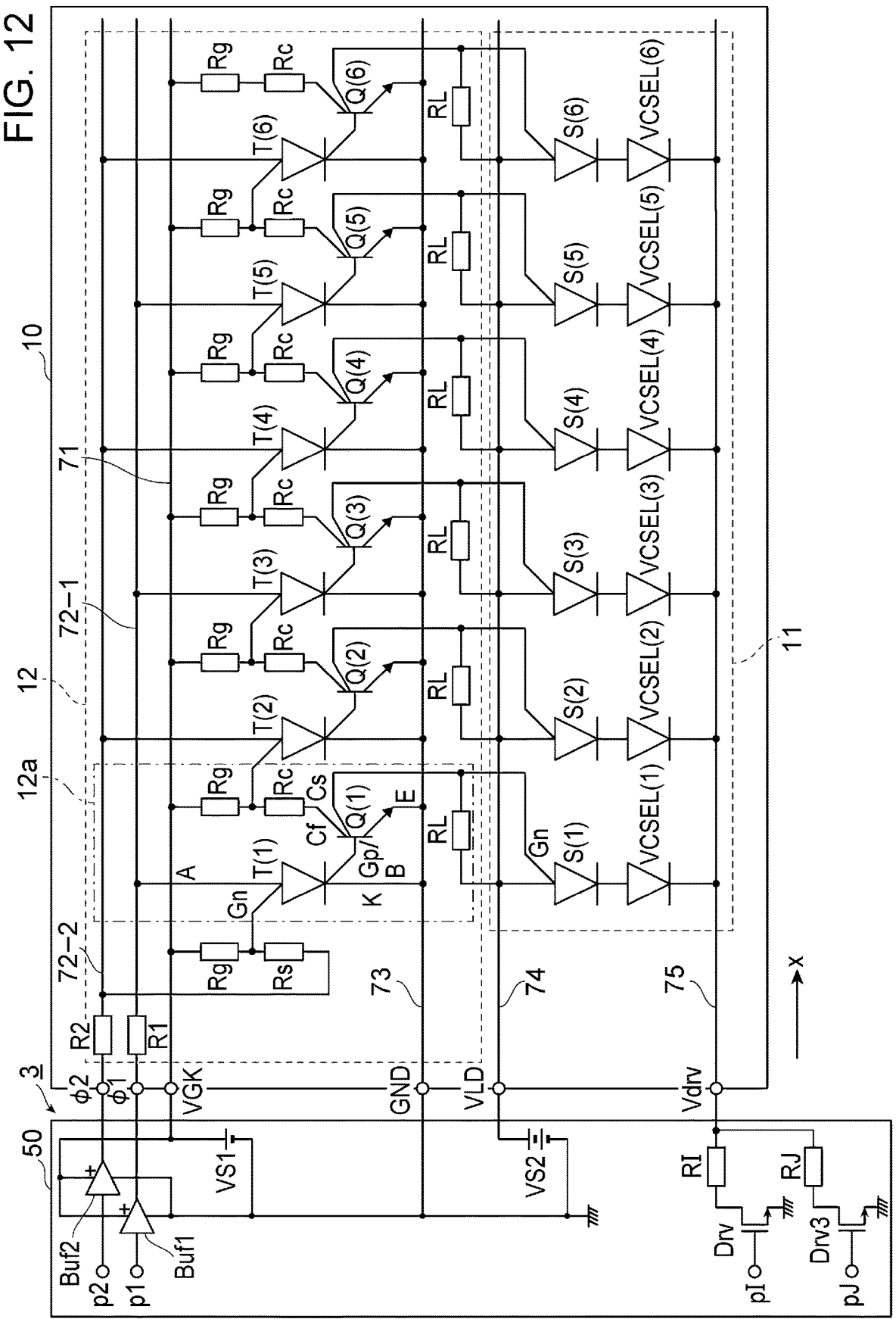
FIG. 12 illustrates a light source device according to a third exemplary embodiment.

FIG. 12 illustrates a light source device 3 according to the third exemplary embodiment. The controller 50 of the light source device 3 includes a driver Drv3 and a reemission current limiting resistor RJ, in addition to the elements provided in the controller 50 of the light source device 1 shown in FIG. 1. The driver Dr3 uses an NMOS transistor, for example, as a driver element and is turned ON/OFF by a reemission stop signal pJ applied to the gate of the NMOS transistor. The source of the NMOS transistor used as the driver Drv3 is grounded, and the drain thereof is connected to the Vdry terminal via the reemission stop current limiting resistor RJ. It is assumed that the reemission stop signal pJ is a signal having a ground potential GND ("L" (0 V)) and a power supply potential VGK ("H" (5 V)). It is also assumed that the driver Drv3 is turned OFF when the reemission stop signal pJ is at "L" (0 V) and is turned ON when the reemission stop signal pJ is at "H" (5 V). That is, the period for which the reemission stop signal pJ is at "H" (5 V) corresponds to a reemission stop pulse, and the length of this period corresponds to the width of the reemission stop pulse. The driver Dry is an example of a first driver, while the driver Drv3 is an example of a second driver.

The ON-resistance Ron of the driver Drv3 is close to 0Ω, and the OFF-resistance Roff thereof is close to ∞ (infinite). When the driver Drv3 is turned ON, the reemission stop current limiting resistor RJ reduces the voltage at the cathode K of the light-emission control thyristor S for a preset reemission stop period (corresponding to the width of the reemission stop pulse) to a value which makes the VCSEL unable to reemit light. For example, the reemission stop current limiting resistor RJ reduces the value of the voltage at the cathode K to the value when the OFF-resistance Roff is 50 kΩ shown in FIG. 8. As stated above, the resistance value of the reemission stop current limiting resistor RJ is set to be a value at which a current higher than or equal to the holding current does not flow through the light-emission control thyristor S.

Figure 13:
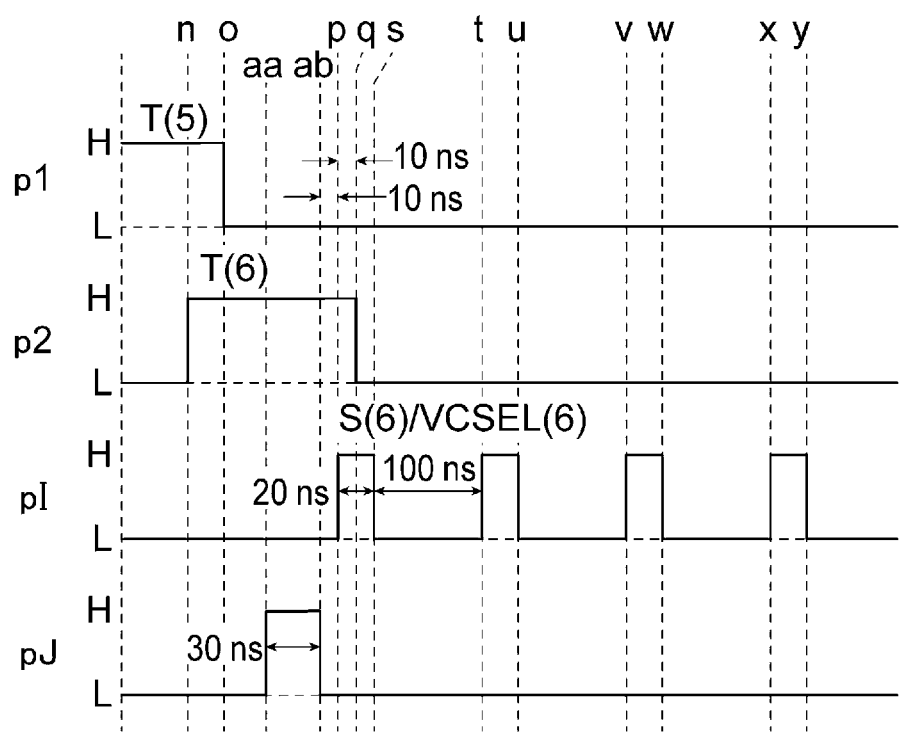
FIG. 13 is a timing chart for explaining a timing at which a reemission stop pulse is provided.

FIG. 13 is a timing chart for explaining a timing at which a reemission stop pulse is provided. To show an example in which the influence of the light-emission control thyristor S(1) and the VCSEL(1) being turned ON is canceled, the time period from time n to time r of the timing chart in FIG. 4 is mainly extracted and a reemission stop pulse is provided during this time period. Time aa and time ab are added to the time period between time o and time p in FIG. 13.

It may be desirable that the reemission stop pulse be provided after the time at which a series of light emission operations of a VCSEL is completed (time d in FIG. 4) and before the time at which the next VCSEL starts emitting light (time p in FIG. 4). In FIG. 13, the VCSEL(6) is caused to emit light as the next VCSEL.

At time n, the shift signal p2 is changed from "L" (0 V) to "H" (5 V), and the shift thyristor T(6) is turned ON and is shifted from the OFF state to the ON state. At time o, the shift signal p1 is changed from "H" (5 V) to "L" (0 V), and the shift thyristor T(5) is turned OFF and is shifted from the ON state to the OFF state.

At time aa, the reemission stop signal pJ is changed from "L" (0 V) to "H" (5 V) and the driver Drv3 is turned ON. This makes any VCSEL unable to reemit light during the period from time aa to time ab. Time aa is a timing at which no elements other than the shift thyristor T(6) for setting the VCSEL(6) to emit light is in the ON state.

At time ab, the reemission stop signal pJ is changed from "H" (5 V) to "L" (0 V) and the driver Drv3 is turned OFF. At time p after time ab, the light-emitting signal pI is changed from "L" (0 V) to "H" (5 V) to cause the VCSEL(6) to emit light. The period from time aa to time ab for which the reemission stop signal pJ is at "H" (5 V) corresponds to a reemission stop pulse.

Although the VCSEL(6) is caused to emit light in this example, another VCSEL may be caused to emit light.

It may be desirable to set a reemission stop pulse after the time at which no elements other than the shift thyristor T for setting a VCSEL to emit light is ON (time o in FIG. 13) and before this VCSEL starts emitting light (time p in FIG. 13). The reason for this is as follows. While the shifter 12 is shifting the ON state, the voltage at the n-gate Gn of the light-emission control thyristor S corresponding to a VCSEL other than the VCSEL to emit light is reduced, and the voltage at the n-gate Gn of the light-emission control thyristor S is fluctuated due to noise during the shift operation. The reemission stop pulse can reset (initialize) the influence of such a voltage drop and a voltage fluctuation. In this manner, the reemission stop pulse contributes to, not only making the previous VCSEL unable to reemit light, but also making any VCSEL in the light-emitting unit 10 unable to emit light. Hence, the reemission stop pulse may be inserted before the first VCSEL is caused to emit light.

If the driver Dry is constituted by an NMOS transistor, the reemission stop current limiting resistor RJ may be provided as follows. Plural resistors having different resistance values which are smaller than the OFF-resistance of the NMOS transistor may be connected in parallel between the source and the drain of the NMOS transistor, and one of the resistors may be used as the reemission stop current limiting resistor RJ. The plural resistors may be connected to the NMOS transistor via a switch and a reemission stop pulse may be generated by changing the state of the switch.

The width of the reemission stop pulse is set to be narrower than that of the light-emitting pulse, and/or the current value of the reemission stop pulse is set to be smaller than that of the light-emitting pulse. This makes it possible for the reemission stop pulse to stop the VCSEL from emitting light more reliably.

As the reemission stop pulse, a pulse having a low velocity dV/dt of a voltage change may desirably be supplied to the driver voltage line 75. Even after the light-emission control thyristor S in the ON state is turned OFF, electric charge stored in the light-emission control thyristor S remains. The light-emitting voltage VLD is applied to the n-gate Gn of the light-emission control thyristor S via the current limiting resistor RL.

Accordingly, electric charge in the n-gate layer 87, which is the n-gate Gn, is more likely to be removed (see FIG. 7B), while electric charge in the p-gate layer 86, which is the p-gate Gp, is more likely to remain (see FIG. 7B). The threshold voltage of the light-emission control thyristor S is varied in accordance with the amount of remaining electric charge. Because of the above-described reason, a pulse having a low velocity dV/dt of a voltage change may be supplied to the driver voltage line 75 so as to raise the threshold voltage of the light-emission control thyristor S, thereby making it difficult for the light-emission control thyristor S to be turned ON.

Although the cathode common configuration is employed in the above-described light-emitting unit 10, the anode common configuration may be utilized. In this case, instead of providing n-ohmic electrodes on an n-gate layer (n-type semiconductor layer 87), p-ohmic electrodes may be provided on a p-gate layer (p-type semiconductor layer 86).

In the shifter 12 of the light-emitting unit 10, a coupling transistor Q is used to connect shift thyristors T. Alternatively, a diode or a resistor may be used to connect shift thyristors T.

In the above-described exemplary embodiments, the light-emitting unit 10 includes plural light-emitting elements that emit light at different timings. However, the exemplary embodiments may be applied to one light-emitting element or to one light-emitting element group including plural light-emitting elements that emit light at the same time.

In the above-described exemplary embodiments, the shifter 12 is used as a setter by way of example.

Alternatively, instead of using a shifter that performs a shift operation, the setter may be configured to cause a driver to directly transmit a signal to the thyristor of a light-emitting element.

(Measurement Apparatus 100)

The light source devices 1, 2, and 3 of the first, second, and third embodiments may be applicable to a measurement apparatus that measures a three-dimensional configuration (hereinafter called a 3D configuration) of a subject to be measured. The measurement apparatus is an apparatus that measures a 3D configuration based on a time-of-flight (ToF) method using the time-of-flight of light. The measurement apparatus includes a light source device and a three-dimensional sensor (hereinafter called a 3D sensor). According to the ToF method, the time from when light is emitted from the light source device until when the 3D sensor receives light reflected by a subject is measured, and based on the measured time, the distance to the subject is calculated. The 3D configuration of the subject is specified in this manner. Measuring a 3D configuration may also be called three-dimensional measurement, 3D measurement, and 3D sensing. The 3D sensor is an example of a light receiver.

The measurement apparatus may be used for recognizing a subject from its specified 3D configuration. For example, the measurement apparatus may be installed in a mobile information processing terminal and be used for recognizing the face of a user who has accessed the mobile information processing terminal. That is, the measurement apparatus obtains the 3D configuration of the face of a user having accessed the mobile information processing terminal, determines whether the user is authorized to access the terminal, and permits the user to use the terminal only when the user is an authorized user.

The measurement apparatus may also be used for continuously measuring the 3D configuration of a subject, such as in augmented reality (AR).

The measurement apparatus may also be applied to an information processing apparatus, such as a personal computer (PC), other than a mobile information processing terminal.

Figure 14:
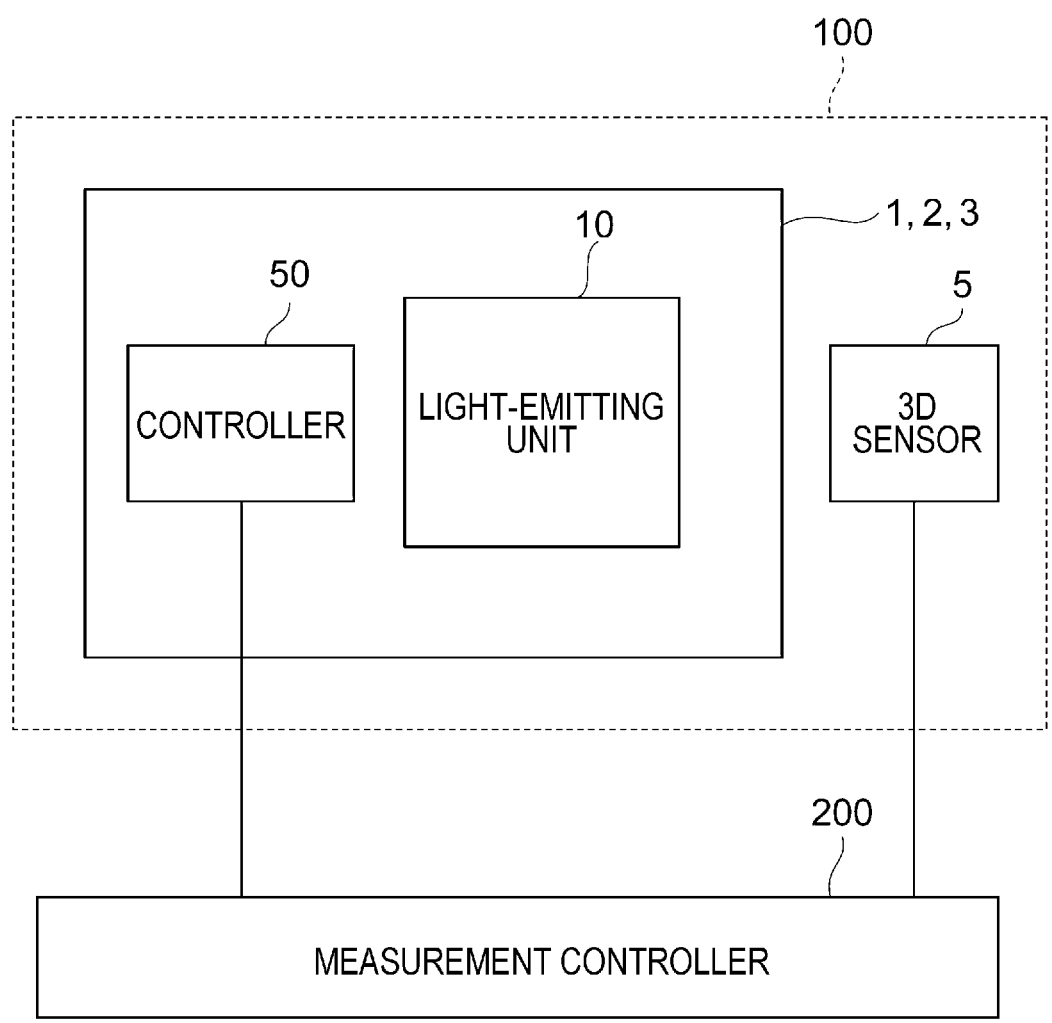
FIG. 14 is a block diagram illustrating the configuration of a measurement apparatus.

FIG. 14 is a block diagram illustrating the configuration of a measurement apparatus 100. The measurement apparatus 100 includes a 3D sensor 5 and the light source device 1, 2, or 3 provided with the light-emitting unit 10 and the controller 50. The light source device 1, 2, or 3 emits light toward a subject. The 3D sensor 5 receives light (reflected light) reflected by and returned from the subject. The 3D sensor 5 outputs information on the distance to the subject (distance information), which is measured by the ToF method based on the time from when light is emitted until when the reflected light is returned. The measurement apparatus 100 may include a measurement controller 200. The measurement controller 200 is constituted by a computer including a central processing unit (CPU), a read only memory (ROM), and a random access memory (RAM), for example. The measurement controller 200 specifies the 3D configuration of a subject, based on the distance information obtained from the 3D sensor 5.

The present disclosure may be implemented as follows.

In a light-emitting unit, a shifter is constituted by transfer elements through which the ON state is transferred in order of the arrangement of the transfer elements. This configuration may make it easier to form the shifter than in the configuration in which the ON state is not transferred.

In a light-emitting unit, as a result of a thyristor of a shifter entering the ON state, a light-emitting element is changed to a state in which it can emit light due to a thyristor function. This may make it possible to separately control the shifter and control the light-emitting unit.

In a light-emitting unit, a light-emitting element is constituted by a surface emitting element and a thyristor connected in series with each other. This may make it easy to enhance the light-emission characteristics.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light source device comprising:
   a light-emitting section including a light-emitting element, the light-emitting element including a thyristor;
   a setter that sets the light-emitting element of the light-emitting section as a light-emitting element that emits light; and
   a controller that cancels an ON setting received from the setter after shifting the light-emitting element to a state in which the light-emitting element is able to emit light and that causes the light-emitting element to emit light a plurality of times by turning ON and OFF a light-emitting current, the light-emitting current causing the light-emitting element to emit light,
   wherein the setter is constituted by thyristors,
   wherein a substrate is provided, and the light-emitting element is provided as a result of sequentially stacking a surface emitting element and a thyristor on the substrate.

2. The light source device according to claim 1, wherein a light-emission interval between light-emitting operations performed by the light-emitting element the plurality of times is set in accordance with a preset period for which the light-emitting element is ready to reemit light, the preset period starting after the light-emitting current supplied to the light-emitting element is turned OFF in a state in which the ON setting is not received from the setter.

3. A measurement apparatus comprising:
   the light source device according to claim 2; and
   a light receiver that receives light which is emitted from the light-emitting section of the light source device and which is reflected by a subject to be measured.

4. The light source device according to claim 1, wherein, before canceling the ON setting received from the setter, the controller causes the light-emitting element to emit light at least one time.

5. A measurement apparatus comprising:
   the light source device according to claim 4; and
   a light receiver that receives light which is emitted from the light-emitting section of the light source device and which is reflected by a subject to be measured.

6. The light source device according to claim 1, wherein:
   the controller includes a driver that turns ON and OFF the light-emitting current at a ground side of a power source, the power source supplying the light-emitting current to the light-emitting element; and
   an OFF-resistance of the driver is set in accordance with a preset period for which the light-emitting element is ready to reemit light, the preset period starting after the light-emitting current supplied to the light-emitting element is turned OFF.

7. The light source device according to claim 6, wherein the OFF-resistance of the driver is formed by a driver element and a resistor disposed in parallel with the driver element.

8. A measurement apparatus comprising:
   the light source device according to claim 7; and
   a light receiver that receives light which is emitted from the light-emitting section of the light source device and which is reflected by a subject to be measured.

9. The light source device according to claim 6, wherein the OFF-resistance of the driver is able to be switched between a plurality of values.

10. A measurement apparatus comprising:
    the light source device according to claim 9; and
    a light receiver that receives light which is emitted from the light-emitting section of the light source device and which is reflected by a subject to be measured.

11. A measurement apparatus comprising:
    the light source device according to claim 6; and
    a light receiver that receives light which is emitted from the light-emitting section of the light source device and which is reflected by a subject to be measured.

12. The light source device according to claim 1, wherein the controller supplies a pulse having a current value smaller than a current value of the light-emitting current while the light-emitting element is emitting light the plurality of times or before the light-emitting element starts to emit light the plurality of times.

13. The light source device according to claim 1, wherein:
    the light-emitting element includes a plurality of light-emitting elements;
    the setter is a shifter that performs a shift operation to set, among the plurality of light-emitting elements of the light-emitting section, a light-emitting element that emits light; and
    the controller sets a shift signal, which is to be supplied to the shifter, to be a ground potential so as to change a state of the shifter to an OFF state.

14. A measurement apparatus comprising:
    the light source device according to claim 1; and
    a light receiver that receives light which is emitted from the light-emitting section of the light source device and which is reflected by a subject to be measured.

15. A light source device comprising:
    a light-emitting section including a light-emitting element, the light-emitting element including a thyristor;
    a setter that sets the light-emitting element of the light-emitting section as a light-emitting element that emits light; and
    a controller that cancels an ON setting received from the setter after shifting the light-emitting element to a state in which the light-emitting element is able to emit light and that causes the light-emitting element to emit light a plurality of times by turning ON and OFF a light-emitting current, the light-emitting current causing the light-emitting element to emit light, wherein the controller supplies a reemission stop pulse to the light-emitting section, the reemission stop pulse making the light-emitting element unable to reemit light.

16. The light source device according to claim 15, wherein:
the controller includes a first driver and a second driver, the first driver turning ON and OFF the light-emitting current at a ground side of a power source, the power source supplying the light-emitting current to the light-emitting element, the second driver supplying the reemission stop pulse; and
an ON-resistance of the second driver is smaller than an OFF-resistance of the first driver and is set to a value which makes the light-emitting element become unable to reemit light when the second driver is turned ON while the first driver is OFF.

17. A light-emitting unit comprising:
a light-emitting section including a plurality of light-emitting elements, each of the plurality of light-emitting elements including a thyristor; and
a setter that sequentially transfers an ON state and that enters the ON state to set, among the plurality of light-emitting elements of the light-emitting section, a light-emitting element which emits light,
wherein a gate of the thyristor of each of the plurality of light-emitting elements is connected to a voltage supply line via a resistor, a light-emitting current being supplied to the light-emitting elements through the voltage supply line.

18. The light-emitting unit according to claim 17, wherein the setter is constituted by thyristors.

19. The light-emitting unit according to claim 18, wherein:
a substrate is provided; and
each of the plurality of light-emitting elements is provided as a result of sequentially stacking a surface emitting element and a thyristor on the substrate, the thyristor forming the thyristor of the corresponding light-emitting element, and the thyristors of the setter are provided on a structure on the substrate, the structure being equivalent to a structure of the light-emitting element.

20. The light-emitting unit according to claim 19, wherein the light-emitting element and the thyristor of the setter are electrically isolated from each other.

* * * * *